(12) United States Patent
Chen

(10) Patent No.: US 7,304,339 B2
(45) Date of Patent: Dec. 4, 2007

(54) PASSIVATION STRUCTURE FOR FERROELECTRIC THIN-FILM DEVICES

(75) Inventor: Lee-Yin V. Chen, Goleta, CA (US)

(73) Assignee: Agile RF, Inc., Goleta, CA (US)

( * ) Notice: Subject to any disclaimer, the term of this patent is extended or adjusted under 35 U.S.C. 154(b) by 0 days.

(21) Appl. No.: 11/470,950

(22) Filed: Sep. 7, 2006

(65) Prior Publication Data

US 2007/0065994 A1 Mar. 22, 2007

Related U.S. Application Data

(60) Provisional application No. 60/719,759, filed on Sep. 22, 2005.

(51) Int. Cl.
*H01L 31/062* (2006.01)

(52) U.S. Cl. ............... 257/295; 257/358; 257/E27.104; 438/3

(58) Field of Classification Search ................... 257/295
See application file for complete search history.

(56) References Cited

U.S. PATENT DOCUMENTS

| | | |
|---|---|---|
| 2,802,171 A | 8/1957 | Minder |
| 3,562,637 A | 2/1971 | Gikow |
| 5,273,609 A | 12/1993 | Moslehi |
| 5,489,548 A | 2/1996 | Nishioka et al. |
| 5,593,914 A | 1/1997 | Evans, Jr. et al. |
| 5,721,700 A | 2/1998 | Katoh |
| 5,790,367 A | 8/1998 | Mateika et al. |
| 5,817,572 A | 10/1998 | Chiang et al. |
| 6,077,737 A | 6/2000 | Yang et al. |
| 6,222,245 B1 | 4/2001 | Bez et al. |
| 6,300,654 B1 | 10/2001 | Corvasce et al. |
| 6,377,440 B1 | 4/2002 | Zhu et al. |
| 6,379,977 B1 | 4/2002 | Sun et al. |
| 6,383,858 B1 | 5/2002 | Gupta et al. |
| 6,432,794 B1 | 8/2002 | Lou |
| 6,451,665 B1 | 9/2002 | Yunogami et al. |

(Continued)

OTHER PUBLICATIONS

Acikel, Baki et al., "A New High Performance Phase Shifter using $Ba_xSr_{1-x}TiO_3$ Thin Films," IEEE Microwave and Wireless Components Letters, vol. 12, No. 7, Jul. 2002, pp. 237-239.

(Continued)

*Primary Examiner*—Tu-Tu Ho
(74) *Attorney, Agent, or Firm*—Fenwick & West LLP

(57) ABSTRACT

Ferroelectric thin film devices including a passivation structure to reduce or control a leakage path between two electrodes and along an interface between a ferroelectric thin film layer and a passivation layer are described. Methods for fabricating such devices are also disclosed. The passivation structure includes a first passivation layer that includes an opening exposing a portion of the ferroelectric thin film layer allowing a second passivation layer to contact the thin film layer through the opening. In an exemplary embodiment, the opening is a rectangular ring surrounding an active region of a capacitor. In another exemplary embodiment, the second passivation layer also contacts the second electrode, a portion of which is also exposed through the opening. In another exemplary embodiment, current flows along the interface between the thin film layer and the passivation layer in an integrated resistor.

47 Claims, 31 Drawing Sheets

U.S. PATENT DOCUMENTS

| | | | |
|---|---|---|---|
| 6,452,776 | B1 | 9/2002 | Chakravorty |
| 6,503,792 | B2 | 1/2003 | Hartner et al. |
| 6,646,499 | B2 | 11/2003 | Tiebout |
| 6,683,341 | B1 | 1/2004 | York |
| 6,737,930 | B2 | 5/2004 | Toncich |
| 7,042,701 | B2 | 5/2006 | Diorio et al. |
| 2001/0040249 | A1* | 11/2001 | Jung ................... 257/295 |
| 2003/0067023 | A1 | 4/2003 | Olewine et al. |
| 2004/0087082 | A1 | 5/2004 | Nakata |
| 2004/0259316 | A1 | 12/2004 | Acikel et al. |
| 2006/0118841 | A1* | 6/2006 | Eliason et al. ............ 257/295 |

OTHER PUBLICATIONS

Acikel, Baki et al., "BST Varactor Design and Fabrication," project funded by DARPA FAME Program, 1 page [online], [retrieved on Jun. 28, 2004]. Retrieved from the Internet<URL: http://my.ece.ucsb.edu/yorklab/Projects/Ferroelectrics/Devices/bstdevicedesign.htm>.

Acikel, Baki et al., "Overview of Program," DARPA FAME Program, 8 pages [online], [retrieved on Jun. 23, 2004]. Retrieved from the Internet<URL: http://my.ece.ucsb.edu/yorklab/Projects/Ferroelectrics/Devices/DeviceDesign.pdf>.

Acikel, Baki et al., "Technology Comparison," DARPA FAME Program, 6 pages [online], [retrieved on Jun. 23, 2004]. Retrieved from the Internet <URL: http://my.ece.ucsb.edu/yorklab/Projects/Ferroelectrics/Devices/VaractorComparison.pdf>.

Erker, Erich G. et al., "Monolithic Ka-Band Phase Shifter Using Voltage Tunable BaSrTiO3 Parallel Plate Capacitors," IEEE Microwave and Guided Wave Letters, vol. 10, No. 1, Jan. 2000, pp. 10-12.

IMS2000 Workshop "Ferroelectric Materials and Microwave Applications," 1 page [online], [retrieved on Jun. 28, 2004]. Retrieved from the Internet <URL: http://my.ece.ucsb.edu/yorklab/Projects/Ferroelectrics/IMS2000%20Workshop/ims2000_workshop.htm>.

Liu, Yu et al., "BaSrTiO$_3$ Interdigitated Capacitors for Distributed Phase Shifter Applications," IEEE Microwave and Guided Wave Letters, vol. 10, No. 11, Nov. 2000, pp. 448-450.

Liu, Yu et al., "High-performance and Low-cost Distributed Phase Shifters Using Optimized BaSrTiO$_3$ Interdigitated Capacitors," Electrical and Computer Engineering Dept., Materials Dept., University of California at Santa Barbara, Santa Barbara, CA 93106, 14 pages [online], [retrieved on Jun. 24, 2003]. Retrieved from the Internet <URL: http://my.ece.ucsb.edu/yorklab/Publications/pubs.htm>.

Nagra, Amit S. et al., "Distributed Analog Phase Shifters with Low Insertion Loss," IEEE Transactions on Microwave Theory and Techniques, vol. 47, No. 9, Sep. 1999, pp. 1705-1711.

Padmini, P. et al., "Realization of High Tunability Barium Strontium Titanate Thin Films by RF Magnetron Sputtering," Applied Physics Letters, vol. 75, Nov. 1999, pp. 3186-3188.

Serraiocco, J. et al., "Tunable Passive Integrated Circuits Using BST Thin Films," presented at IFFF 2002, International Joint Conference on the Applications of Ferroelectrics, Kyoto, Japan, May 2002, 10 pages [online], [retrieved on Jun. 24, 2003]. Retrieved from the Internet <URL: http://my.ece.ucsb.edu/yorklab/Publications/pubs.htm>.

Taylor, T. R. et al., "Impact of thermal strain on the dielectric constant of sputtered barium strontium titanate thin films," Applied Physics Letters, vol. 80, No. 11, Mar. 18, 2002, pp. 1978-1980.

Taylor, T. R. et al., "Optimization of RF Sputtered Barium Strontium Titanate (BST) Thin Films for High Tunability," presented at MRS Conference, Fall 1999, 2 pages [online], [retrieved on Jun. 24, 2003]. Retrieved from the Internet <URL: http://my.ece.ucsb.edu/yorklab/Publications/pubs.htm>.

Taylor, T. R. et al., "RF Sputtered High Tunability Barium Strontium Titanate (BST) Thin Films for High Frequency Applications," presented at ISIF 2000 Conference, Aachen, Germany, Mar. 2000, 2 pages [online], [retrieved on Jun. 24, 2003]. Retrieved from the Internet <URL: http://my.ece.ucsb.edu/yorklab/Publications/pubs.htm>.

Taylor, Troy et al., "BST Growth Optimization," project funded by DARPA FAME Program, 2 pages [online], [retrieved on Jun. 28, 2004]. Retrieved from the Internet <URL: http://my.ece.ucsb.edu/yorklab/Projects/Ferroelectrics/Materials/growthopt.htm>.

Taylor, Troy et al., "Loss Model for BST Test Capacitors," DARPA FAME Program, 6 pages [online], [retrieved on Jun. 23, 2004]. Retrieved from the Internet <URL: http://my.ece.ucsb.edu/yorklab/Projects/Ferroelectrics/Materials/LowFrequency.pdf>.

Taylor, Troy et al., "Materials Issues To Be Explored," DARPA FAME Program, 10 pages [online], [retrieved on Jun. 23, 2004]. Retrieved from the Internet <URL: http://my.ece.ucsb.edu/yorklab/Projects/Ferroelectrics/Materials/growth.pdf>.

York, Bob et al., "Thin-Film Ferroelectrics: Deposition Methods and Applications," presented at the International Microwave Symposium in Boston, MA, Jun. 2000, p. 20 [online], [retrieved on Jun. 23, 2004]. Retrieved from the Internet <URL: http://my.ece.ucsb.edu/yorklab/Projects/Ferroelectrics/IMS2000%20Workshop/Bob-oral.pdf>.

York, R. et al., "Books and Book Chapters," Microwave Electronics Lab, 4 pages [online], [retrieved on Jun. 23, 2004]. Retrieved from the Internet <URL: http://my.ece.ucsb.edu/yorklab/Publications/pubs.htm>.

York, R. et al. "Microwave Integrated Circuits using Thin-Film BST," presented at ISAF Conference, Honolulu, Hawaii, Jul. 21-Aug. 2, 2000, 6 pages [online], [retrieved on Jun. 24, 2003]. Retrieved from the Internet <URL: http://my.ece.ucsb.edu/yorklab/Publications/pubs.htm>.

York, Robert A. et al., "Synthesis and Characterization of $(Ba_xSr_{1-x})Ti_{1+y}O_{3+z}$ Thin Films and Integration into Microwave Varactors and Phase Shifters," Journal of Integrated Ferroelectrics, vol. 34, Apr. 10, 2000, pp. 177-188.

York, Robert A. et al., "Thin-Film Phase Shifters for Low-Cost Phased Arrays," presented at Workshop on Affordability and Cost Reduction for Radar Systems, Huntsville, Alabama, Apr. 2000 and at URSI Conference, Salt Lake City, Utah, Jul. 2000, 10 pages [online], [retrieved on Jun. 24, 2003]. Retrieved from the Internet <URL: http://my.ece.ucsb.edu/yorklab/Publications/pubs.htm>.

* cited by examiner

US 7,304,339 B2

PASSIVATION STRUCTURE FOR FERROELECTRIC THIN-FILM DEVICES

CROSS-REFERENCE TO RELATED APPLICATIONS

This application claims priority under 35 U.S.C. § 119(e) from co-pending U.S. Provisional Patent Application No. 60/719,759, entitled "Passivation Structure for Ferroelectric Thin-Film Devices," filed on Sep. 22, 2005, which is incorporated by reference herein in its entirety. This application is also related to U.S. patent application Ser. No. 10/822,563, "Fabrication of Parallel Plate Capacitors Using BST Thin Film," filed on Apr. 8, 2004, which is incorporated herein by reference in its entirety.

BACKGROUND OF THE INVENTION

1. Field of the Invention

This invention relates generally to fabrication of barium strontium titanate (BST) thin film devices, and more particularly, to passivation of BST thin film capacitors and fabrication of BST thin film resistors.

2. Description of the Related Art

Fabrication processes for semiconductor devices usually include one or more passivation layers. Passivation layers may be used, for example, to separate active components or active layers, such as metal lines. They can also be used as the dielectric for MIM or inter-digital capacitors. Additionally, passivation layers may be used to prevent contamination of, and enhance the reliability of, the final fabricated device.

The materials used for the passivation layers are usually chosen based on process availability, compatibility with previous processing, and desired characteristics. In particular, materials that can be utilized in other parts of the design are preferable to reduce design complexity and to minimize manufacturing costs. Typical examples of passivation layer materials include silicon nitride ($Si_3N_4$), silicon dioxide ($SiO_2$), and aluminum oxide ($Al_2O_3$). $Si_3N_4$ is desirable for its ability to define small critical dimensions, but its thickness may be limited due to stress effects. In contrast, $SiO_2$ may be used for thicker layers with fewer stress effects.

The passivation layers used in fabrication processes are intended to have little or no effect on the behavior and characteristics of underlying devices. In practice, however, the interface between the passivation layer and other active layers may produce paths for leakage currents to flow. These paths, also called "leakage paths," are undesirable for power efficiency and reliability.

FIG. 1 is a cross-sectional view of an integrated circuit 100 fabricated using semiconductor process technology including a conventional passivation scheme. Integrated circuit 100 includes a tunable BST capacitor 105 and a fixed capacitor 110. Capacitors, which are a basic building block for electronic circuits, may be fabricated in various configurations. One design for capacitors is the parallel-plate configuration, in which a dielectric is sandwiched between two electrodes, as shown for capacitors 105, 110 in FIG. 1. The use of semiconductor process technology allows the fabrication of many capacitors on a single wafer and also permits the integration of capacitors with other circuitry.

In FIG. 1, the tunable BST capacitor 105 includes a bottom electrode 115, which may be a conducting layer such as a metal, formed on a substrate 120. A ferroelectric BST thin film dielectric layer 125 is sandwiched between the bottom electrode 115 and a top electrode 130, which may be another metal layer. An additional conductive layer 135 may be provided to form a low resistance contact to the top electrode 130. A first passivation layer 140 protects the bottom electrode 115, the dielectric layer 125, and the top electrode 130. Because of the high dielectric constant of BST, the top electrode 130 is sometimes small in physical dimension, requiring the first passivation layer 140 to have excellent step coverage and to be capable of patterning small critical dimensions. For semiconductor processes, $Si_3N_4$ is often used, although $SiO_2$ and $Al_2O_3$ may also be used. A second passivation layer 145 protects the entire structure, and includes openings 150 to allow electrical contact to the BST capacitor 105.

The fixed capacitor 110 includes a bottom electrode 155, which may be formed using the same conducting layer as the bottom electrode 115 of the BST capacitor 105. The passivation layer 140 serves as the dielectric layer for the fixed capacitor 110, while the conductive layer 135 serves as the top electrode for the fixed capacitor 110.

A major drawback to conventional passivation of the BST capacitor 105, however, is the formation of a leakage path 160 along the interface of the dielectric layer 125 and the first passivation layer 140, as shown in FIG. 1. This leakage path 160 between the top electrode 130 and the bottom electrode 115 can be undesirable for power efficiency and reliability, particularly if it is uncontrolled.

Thus, there is a need to reduce and/or control the leakage path formed along the interface of the ferroelectric dielectric layer between the electrodes of ferroelectric thin film devices.

SUMMARY OF THE INVENTION

Embodiments of the present invention overcome the limitations of the prior art by providing a passivation structure, and methods for fabricating it, for ferroelectric thin film devices, for example, capacitors and integrated resistors. The passivation structure can reduce and control the leakage path that can form along the interface of the ferroelectric thin film dielectric layer and the passivation layer between the electrodes of the device, improving long term reliability and DC power consumption of the devices. Advantageously, the passivation structure can be obtained without major changes to the existing fabrication process, and embodiments of devices and processes described herein allow the BST process to be compatible with typical semiconductor processes. Also, embodiments of devices and processes described herein can retain the first passivation layer, typically $Si_3N_4$, to take advantage of its benefits, such as tight processing tolerance, but reduce or eliminate its drawbacks, specifically, induction of the leakage path.

In one aspect of the disclosed embodiments, a ferroelectric thin film device has a first electrode integrated on a substrate, a ferroelectric thin film layer contacting the first electrode, and a second electrode contacting the ferroelectric thin film layer. A first passivation layer overlies the first electrode, the ferroelectric thin film layer, and the second electrode, and includes an opening exposing a portion of the ferroelectric thin film layer along a path that extends along a surface of the ferroelectric thin film layer between the first electrode and the second electrode. A second passivation layer contacts the ferroelectric thin film layer through the opening. In a particular design embodiment, the opening also exposes a portion of the second electrode, and the second passivation layer also contacts the second electrode.

In another aspect of the disclosed embodiments, a ferroelectric parallel plate capacitor has a first electrode, a dielectric layer overlying a portion of the first electrode, and a second electrode overlying a portion of the dielectric layer. A first passivation layer overlies the first electrode, the dielectric layer, and the second electrode, and includes an opening exposing a portion of the dielectric layer along a path that extends along a surface of the dielectric layer between the top electrode and the bottom electrode. A second passivation layer contacts the dielectric layer through the opening. In a particular design embodiment, the opening also exposes a portion of the second electrode, and the second passivation layer also contacts the second electrode.

In another aspect of the disclosed embodiments, a ferroelectric parallel plate capacitor may be fabricated by forming a bottom electrode supported by a substrate. A ferroelectric thin film dielectric layer is formed over the bottom electrode. A top electrode is formed over the dielectric layer. A first passivation layer is formed overlying the bottom electrode, the dielectric layer, and the top electrode. An opening in the first passivation layer exposes a portion of the dielectric layer along a path that extends along a surface of the dielectric layer between the top electrode and the bottom electrode. A second passivation layer is formed overlying the first passivation layer and contacts the dielectric layer through the opening. In a particular design embodiment, the second passivation layer also contacts the bottom electrode through the opening.

In another aspect of the disclosed embodiments, a ferroelectric thin film resistor has a first electrode integrated on a substrate, a ferroelectric thin film layer contacting the first electrode, and a second electrode contacting the ferroelectric thin film layer. A first passivation layer overlies the first electrode, the ferroelectric thin film layer, and the second electrode. A current flow through the resistor flows at an interface between the ferroelectric thin film layer and the first passivation layer. In a particular design embodiment, the first passivation layer includes an opening exposing a portion of the ferroelectric thin film layer along a path between the electrodes along the interface between the ferroelectric thin film layer and the first passivation layer, and a second passivation layer overlying the first passivation layer contacts the ferroelectric thin film layer through the opening.

In various aspects of the disclosed embodiments, the opening in the first passivation layer can have a variety of shapes to interrupt the leakage path of the ferroelectric device as needed. For example, the opening can form a ring structure around an active region of the device, or the opening may only partially surround the active region device. As a specific example, the opening may be a rectangular ring.

In particular design embodiments, one or both electrodes may be platinum, the first passivation layer may be silicon nitride, the second passivation layer may be polyimide, and the ferroelectric thin film layer may be barium titanate, strontium titanate, or a composite of the two.

BRIEF DESCRIPTION OF THE DRAWINGS

The disclosed embodiments have other advantages and features which will be more readily apparent from the following detailed description and the appended claims, when taken in conjunction with the accompanying drawings, in which:

DETAILED DESCRIPTION OF THE EMBODIMENTS

Embodiments of passivation structures, including methods of fabrication, for ferroelectric thin film devices, such as BST capacitors, are described herein. The passivation structures and their methods of fabrication advantageously require minimal change to existing fabrication processes.

Parallel Plate Capacitors

Figure 1:
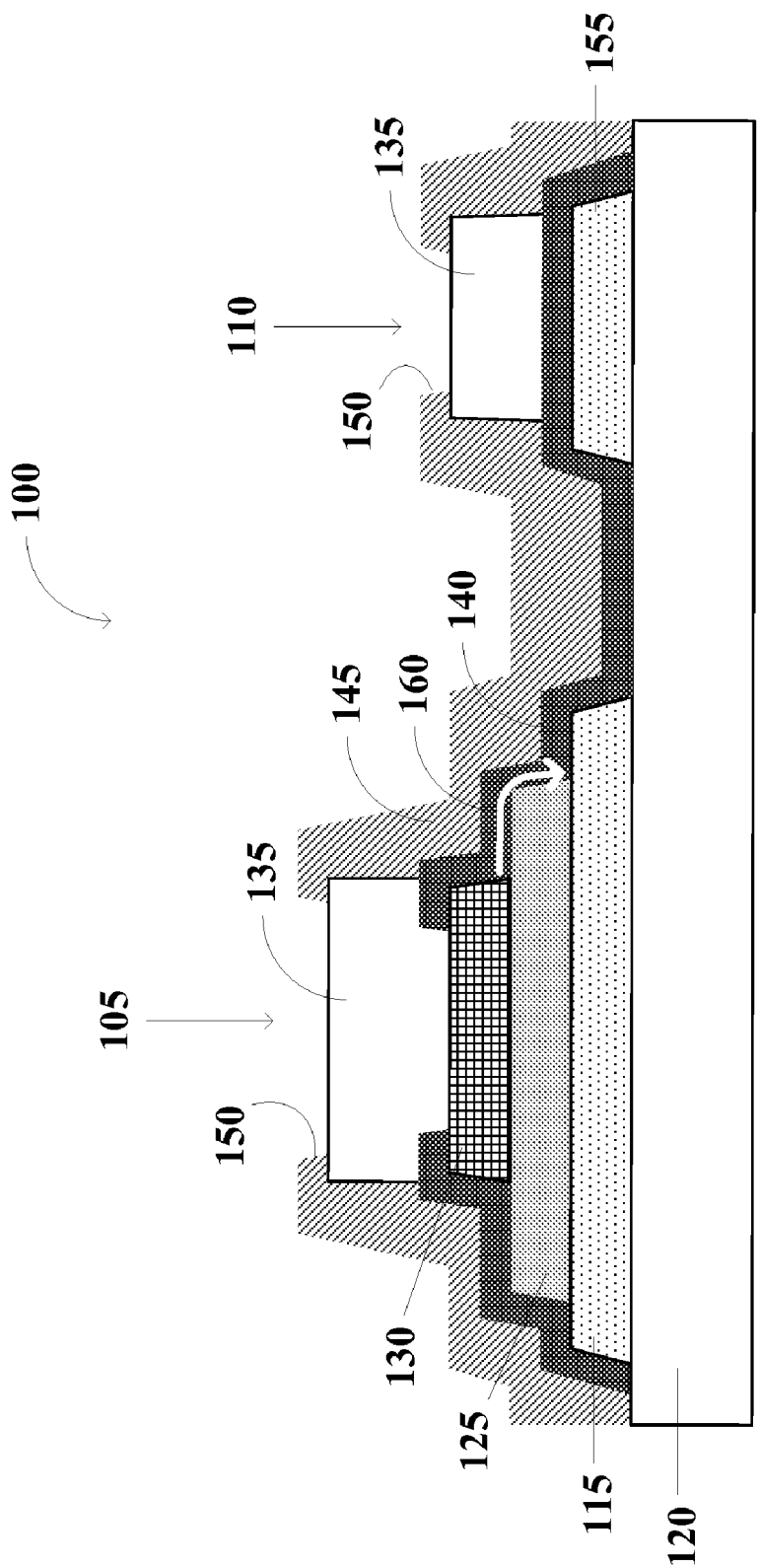
FIG. 1 is a cross-sectional view of an integrated circuit fabricated using semiconductor process technology including a conventional passivation scheme.
Figure 2:
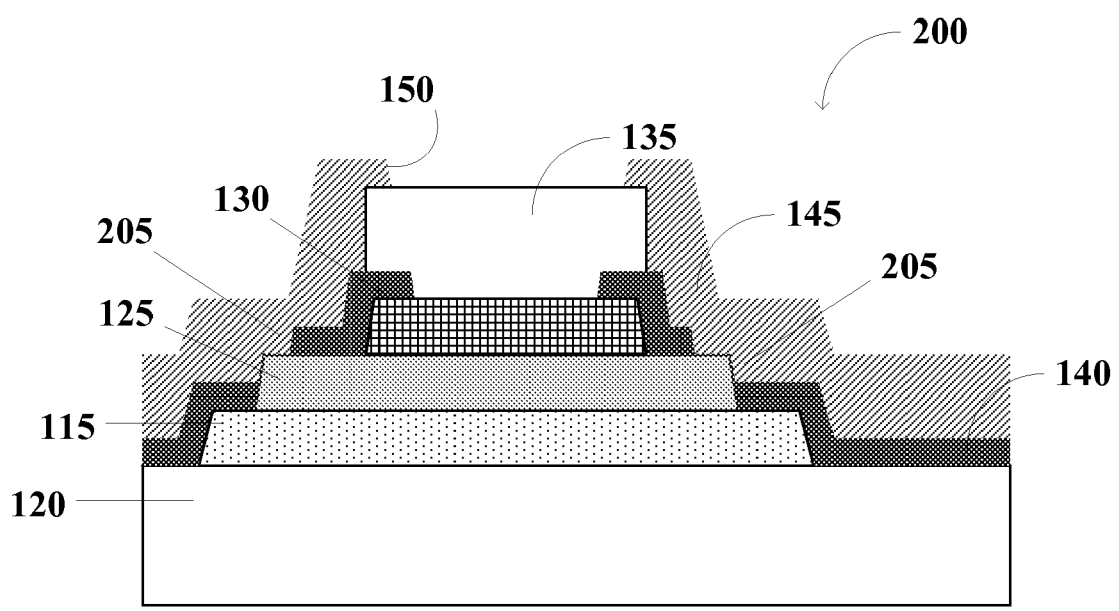
FIG. 2 is a cross-sectional view of one embodiment of a BST capacitor including a passivation structure in accordance with the present invention.

FIG. 2 is a cross-sectional view of a BST capacitor 200 including a passivation structure in accordance with one embodiment of the present invention. Similarly to the BST capacitor 105 of FIG. 1, the BST capacitor 200 is integrated on a substrate 120 and includes a bottom electrode 115, a top electrode 130, and a BST thin film dielectric layer 125 sandwiched between the top electrode 130 and the bottom electrode 115. The active region of the capacitor is defined by the overlap between the top electrode 130, the dielectric layer 125, and the bottom electrode 115. An additional conductive layer 135 is provided to form a low resistance contact to the top electrode 130. As in FIG. 1, a first passivation layer 140, for example, $Si_3N_4$, protects the bottom electrode 115, the dielectric layer 125, and the top electrode 130, while a second passivation layer 145 protects the entire structure and includes openings 150 to allow electrical contact to the BST capacitor 200.

Figure 3A:
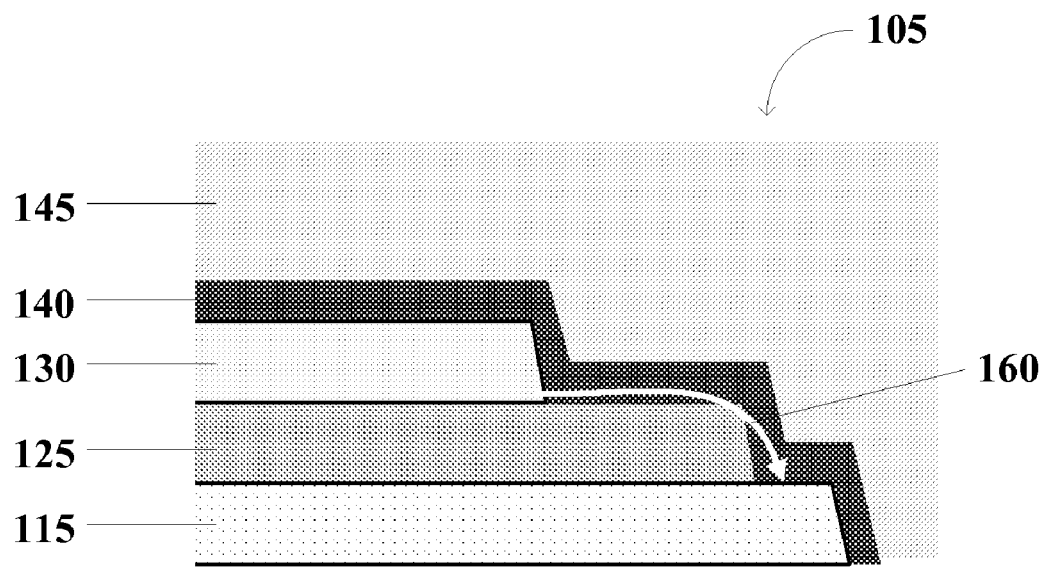
FIGS. 3A and 3B are enlarged cross-sectional views of the BST capacitor of FIG. 1 and the BST capacitor of FIG. 2, respectively.
Figure 3B:
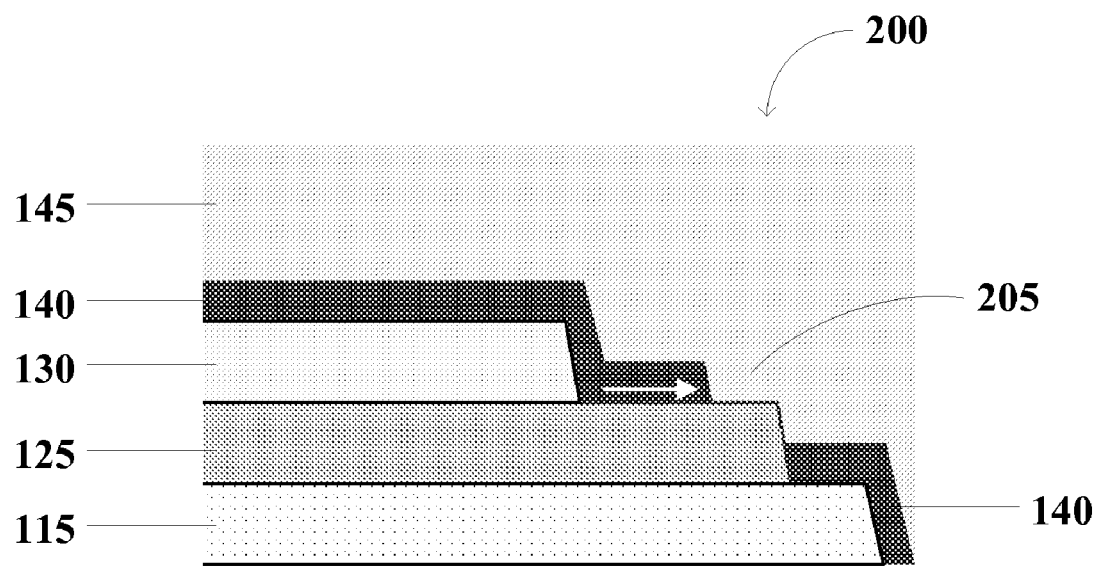

The passivation layer 140 of the BST capacitor 200, however, also includes an opening 205 to interrupt the leakage path that can form between the top electrode 130 and the bottom electrode 115 at the interface of the dielectric layer 125 and the passivation layer 140. FIGS. 3A and 3B are enlarged cross-sectional views of the BST capacitor 105 of FIG. 1 and the BST capacitor 200 of FIG. 2, respectively, illustrating the function of the opening 205 in the passivation layer 140. The leakage path 160 that exists in the conventional BST capacitor 105 of FIG. 3A is broken by the opening 205 in the passivation layer 140 in the BST capacitor 200 of FIG. 3B. Since most openings in passivation layers, such as passivation layer 140, are obtained by dry or wet etch, the area of the dielectric layer 125 near the top electrode 130 should be protected by leaving a portion of the passivation layer 140 intact. Another portion of the passivation layer 140, however, at or near the edge of the dielectric layer 125 can be removed to form the opening 205 to prevent current flow between the top electrode 130 and the bottom electrode 115. The exposed dielectric layer 125 is covered by the second passivation layer 145, which may be, for example, a polyimide or a layer of bisbenzocyclobutene (BCB) that does not induce the leakage path 160.

Figure 4:
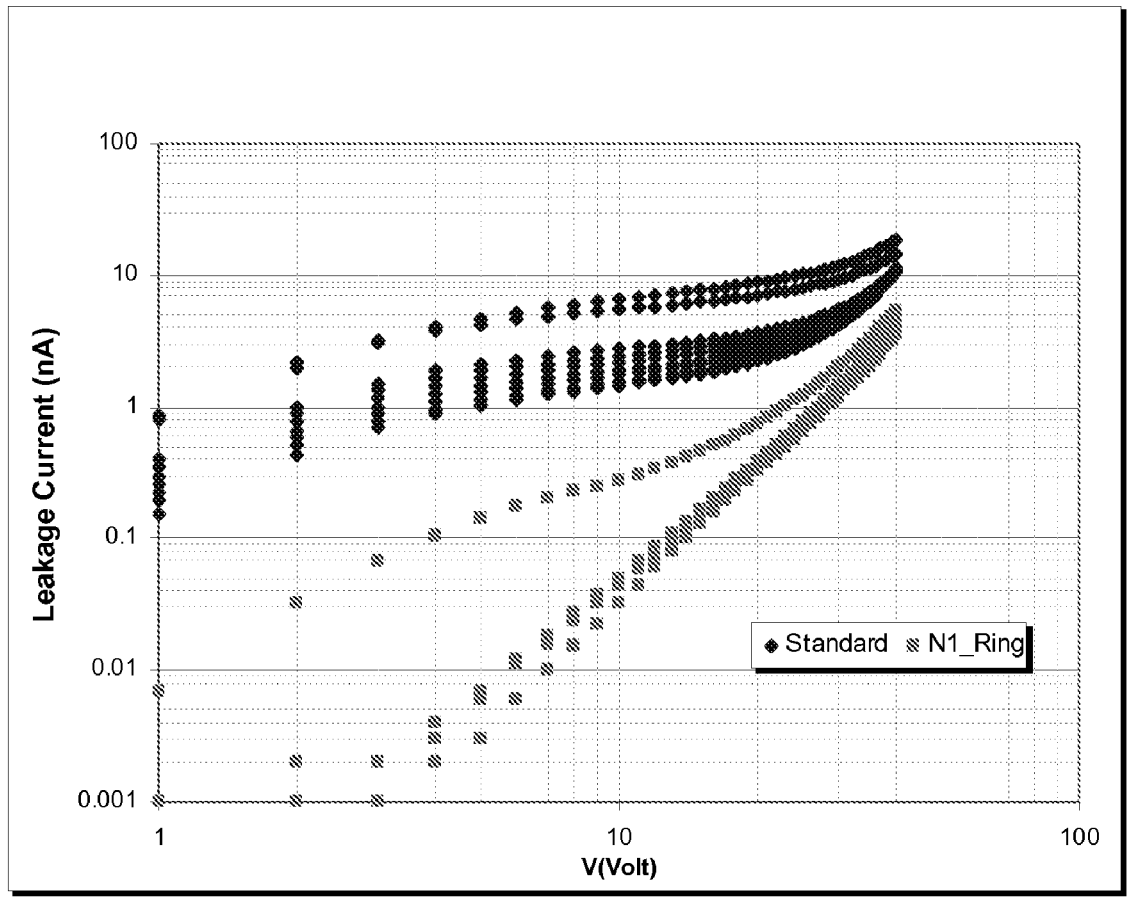
FIG. 4 compares leakage current versus voltage characteristics of a conventional BST devices and BST devices fabricated with ring passivation structures in accordance with the present invention.

FIG. 4 compares leakage current versus voltage characteristics of conventional BST devices and BST devices fabricated with ring passivation structures in accordance with the present invention. All devices measured were 15 μm by 15 μm BST capacitors from the same wafer. Standard, i.e., conventional, BST devices, such as the BST capacitor 105 of FIG. 1, are indicated by diamonds. BST devices in accordance with the present invention, such as the BST capacitor 200 of FIG. 2, are indicated by squares and labeled "N1$_{13}$Ring," and include openings shaped as rings surrounding the capacitors in the first passivation layer (N1). FIG. 4 indicates the leakage current for BST capacitors fabricated with a passivation structure in accordance with one embodiment of the present invention were significantly lower than the leakage current of standard BST capacitors.

Figure 5:
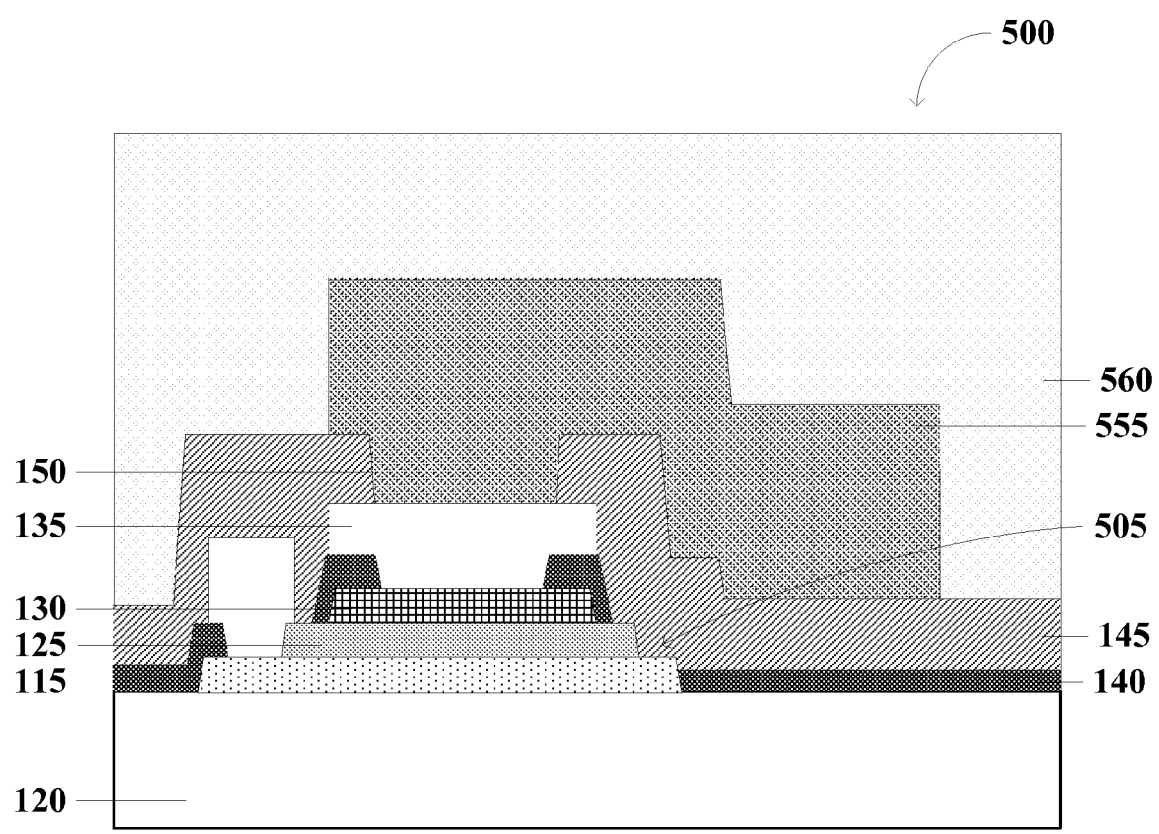
FIG. 5 is a cross-sectional view of a BST capacitor including a passivation structure in accordance with another embodiment of the present invention.

FIG. 5 is a cross-sectional view of a BST capacitor 500 including a passivation structure in accordance with another embodiment of the present invention. The BST capacitor 500 is similar to the BST capacitor 200 of FIG. 2 and includes a substrate 120, a bottom electrode 115, a top electrode 130, and a BST thin film dielectric layer 125 sandwiched between the top electrode 130 and the bottom electrode 115. A conductive layer 135 forms a low resistance contact to the top electrode 130. As in FIG. 2, a first passivation layer 140, for example, Si$_3$N$_4$, protects the bottom electrode 115, the dielectric layer 125, and the top electrode 130. A second passivation layer 145 protects the entire BST capacitor 500 and includes openings 150 to allow electrical contact to the BST capacitor 500 with a conductive layer 555. A third passivation layer 560 overlies the entire structure. As in FIG. 2, the passivation layer 140 of the BST capacitor 500 also includes an opening 505 to interrupt the leakage path that can form between the top electrode 130 and the bottom electrode 115 at the interface of the dielectric layer 125 and the passivation layer 140. The opening 505 is larger, however, than the opening 205 of FIG. 2 and also exposes a portion of the bottom electrode 115. Those skilled in the art will appreciate that the openings 205 and 505 are merely illustrative of various configurations that may be possible for the passivation structure of the current invention.

FIGS. 6A-6H are top view and cross-sectional view pairs, illustrating an exemplary fabrication process for BST parallel plate capacitors in accordance with the present invention. Each individual figure shows a different phase of fabrication, while the sequence of figures shows the overall fabrication process. Each figure shows both a top view and a corresponding cross-sectional view, through the line A-A, of the capacitor during fabrication. The fabricated capacitor is shown in the last figure of the sequence. In the top view of each figure, the layer currently being processed is shown in a heavy weight line, except for the last figure of the sequence, which shows the first passivation layer in a heavy weight line. While the process described in FIGS. 6A-6H illustrates fabrication of the BST capacitor 500 of FIG. 5, the process may also be used to fabricate other BST capacitors, such as the BST capacitor 200 of FIG. 2.

Figure 6A:
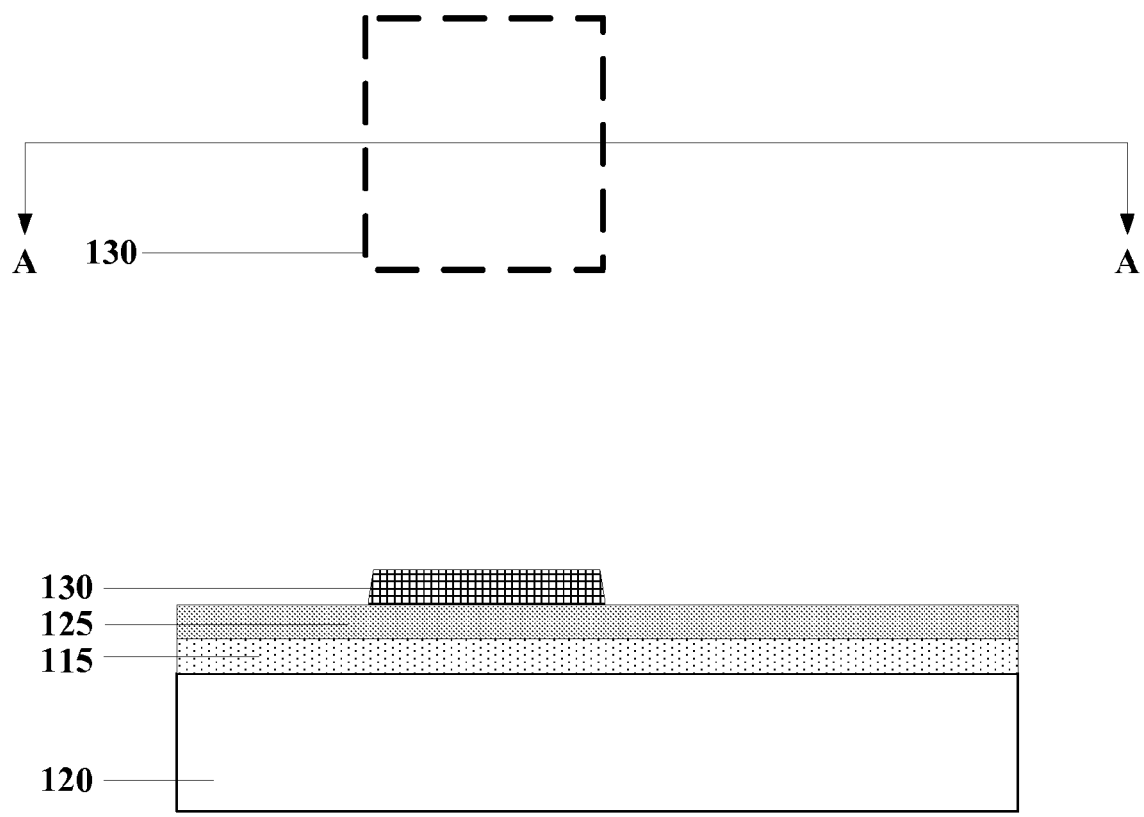
FIGS. 6A-6H are top view and cross-sectional view pairs, illustrating an exemplary fabrication process for BST parallel plate capacitors in accordance with the present invention.

Referring to FIG. 6A, the process begins with a substrate 120 including a sandwich structure of layers comprising a bottom electrode 115, a BST thin film dielectric layer 125, and a top electrode 130. To reduce costs, temperature resistant, inexpensive, insulating substrates 120 are usually preferred, including but not limited to high-resistivity silicon (HR Si), crystalline sapphire (Al$_2$O$_3$), aluminum nitride (AlN), quartz, and glass. These substrates are preferably polished for low surface roughness for compatibility with growth of smooth ferroelectric films with high breakdown fields.

In one particular embodiment of the fabrication process, the bottom electrode 115 is a thin layer of platinum, which may be deposited on the substrate 120 by sputtering or evaporation. Platinum is selected for compatibility with the BST thin film processing. A thin layer for the bottom electrode 115 is preferred to minimize roughness during subsequent processing. In this embodiment, the top electrode 130 may also be a thin layer of platinum, formed over the BST thin film dielectric layer 125.

Examples of suitable BST thin film materials for BST thin film dielectric layer 125 include barium titanate, strontium titanate, and composites of the two. For convenience, the term "BST" is used throughout to refer to all of these materials even though, strictly speaking, barium titanate does not contain strontium and strontium titanate does not contain barium. The terms "barium titanate", "strontium titanate", and "barium strontium titanate" shall be used to refer to the specific materials. This is strictly for convenience, to avoid having to repeat the phrase "barium titanate, strontium titanate and/or barium strontium titanate" throughout. The BST materials can also include small concentrations of one or more dopants to modify certain properties. The BST thin film dielectric layer 125 may be grown or deposited over the layer for the bottom electrode 115.

As shown in FIG. 6A, the top electrode 130 is formed in the layer of platinum using standard photolithography and etch techniques to remove selected portions of the top electrode layer to form the lateral shape of the top electrode 130. Specifically, a layer of photoresist is deposited over the top electrode layer and patterned to define the top electrode 130. The exposed portions of the top electrode layer are then etched away, for example, by ion milling.

Figure 6B:
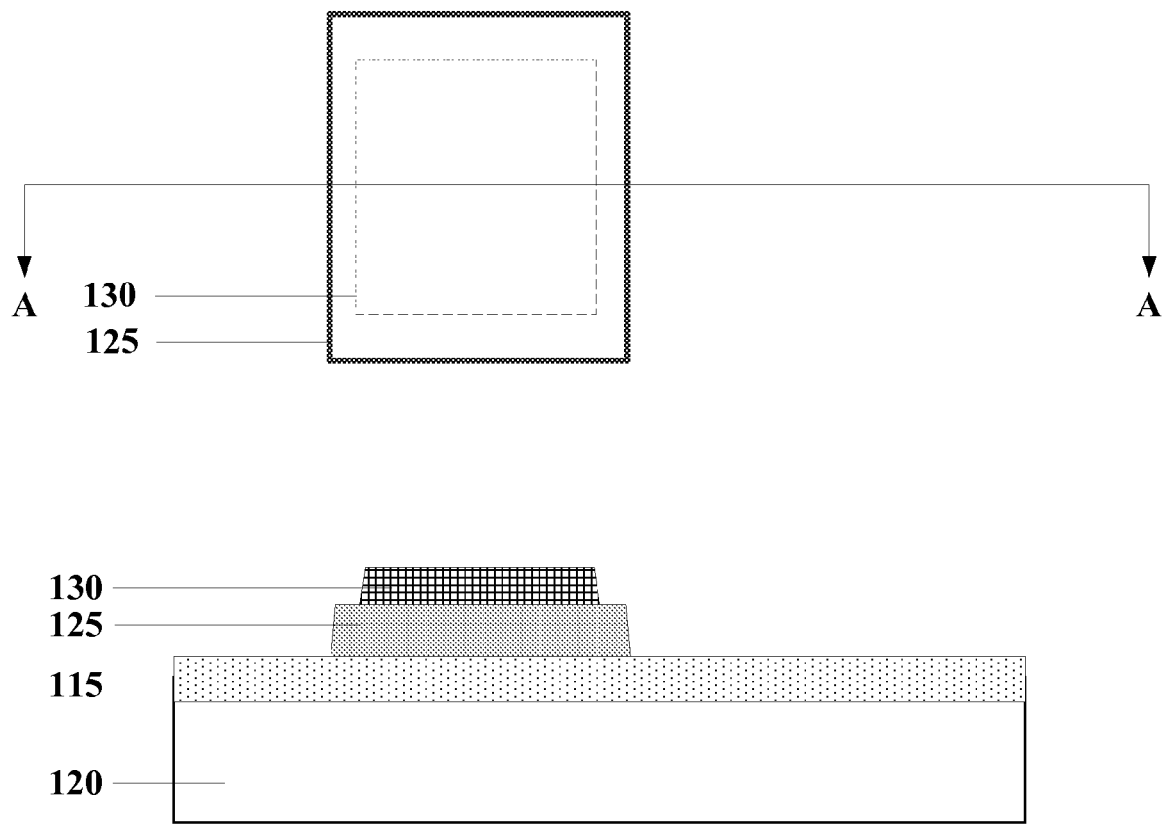

Referring to FIG. 6B, the BST thin film dielectric layer 125 is then etched using standard etch techniques. The dielectric layer 125 may be wet etched or dry etched, for example, by ion milling. A patterned photoresist layer may act as an etch mask.

Figure 6C:
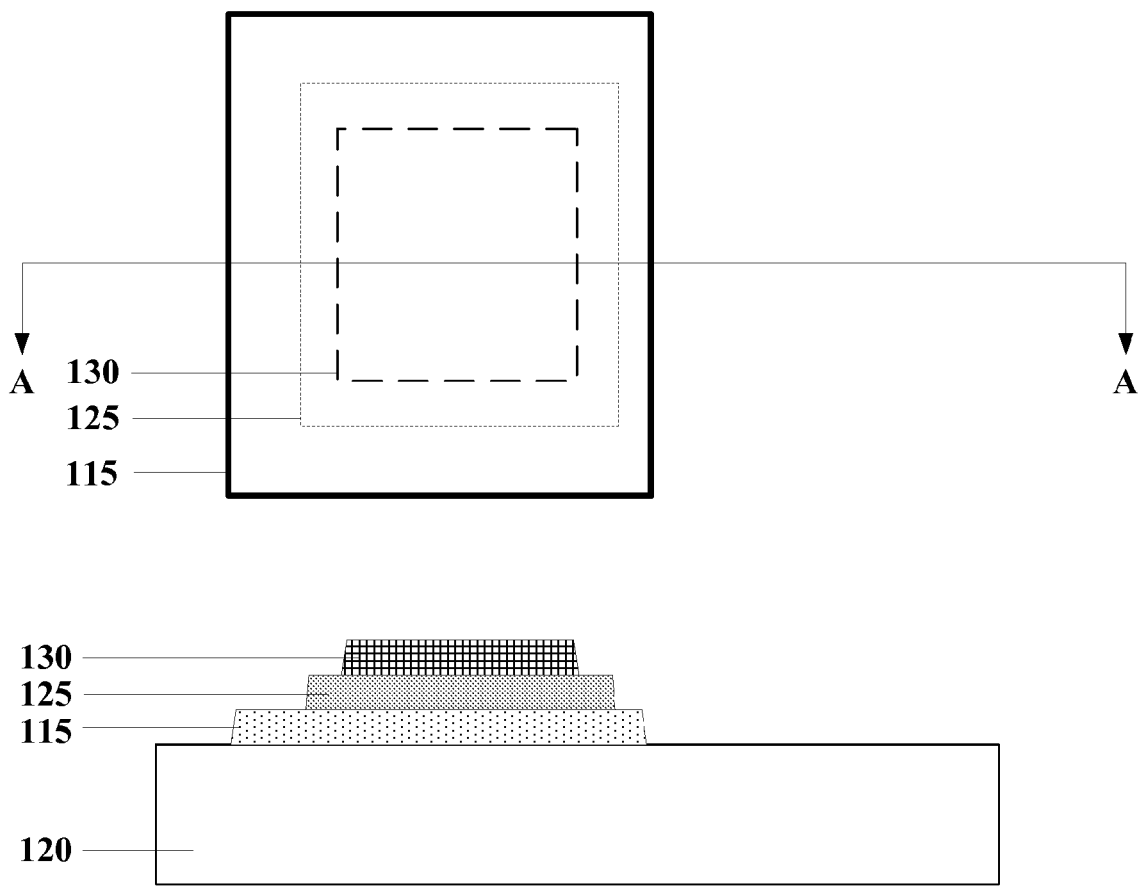

Referring to FIG. 6C, the bottom electrode 115 is then formed in the bottommost layer of platinum using standard photolithography and etch techniques, for example, ion milling, to remove selected portions of the bottom electrode layer to form the lateral shape of the bottom electrode 115.

Figure 6D:
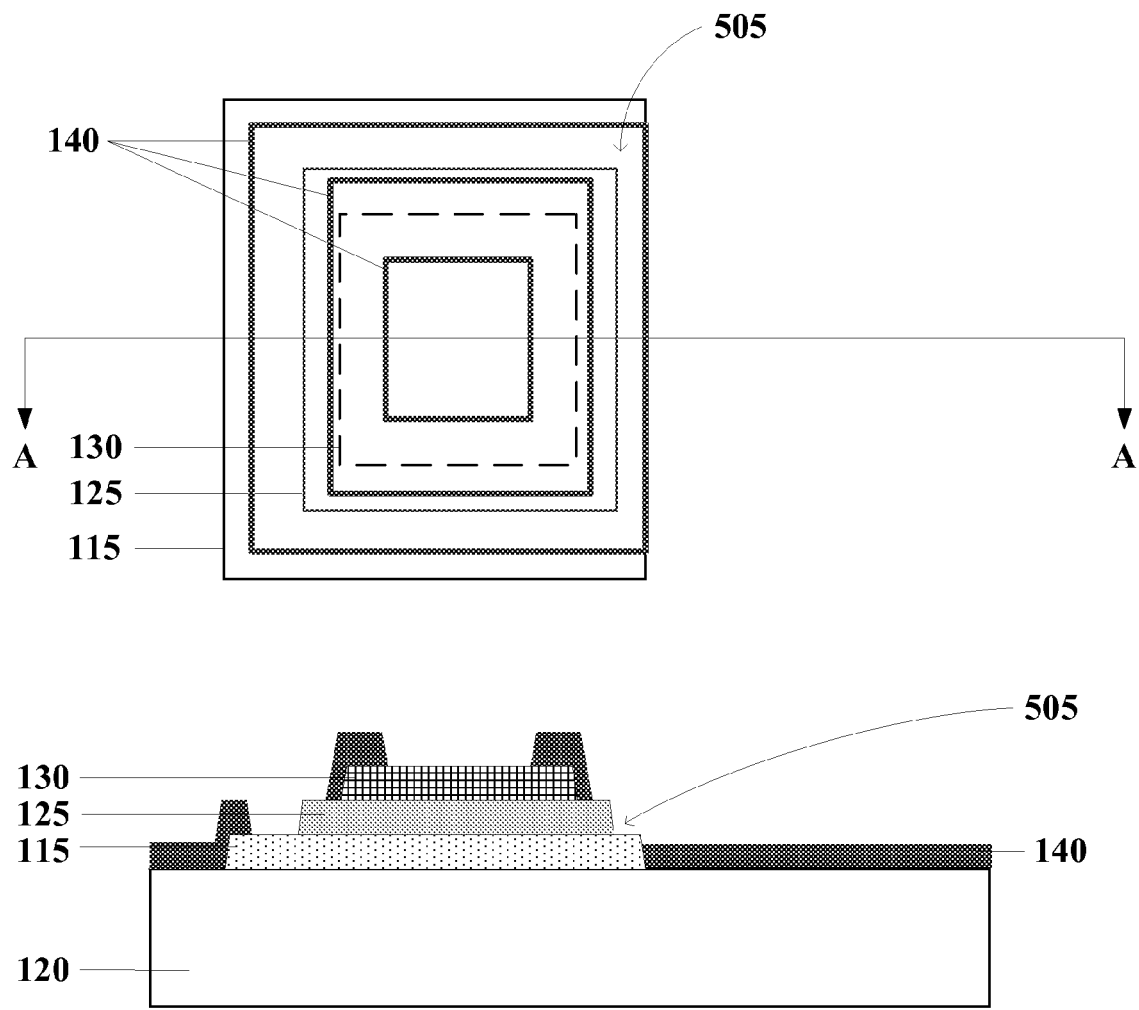

Referring to FIG. 6D, a passivation structure is formed. In this example, the material for the first passivation layer 140 is silicon nitride, $Si_3N_4$, which is deposited over the structure and etched using standard photolithography and etch techniques, such as reactive ion etching. In particular, the $Si_3N_4$ layer is patterned to form a center opening to provide access to the top electrode 130. The $Si_3N_4$ layer is also patterned to form an opening 505 to break the leakage path that forms between the top electrode 130 and the bottom electrode 115 at the interface of the dielectric layer 125 and the passivation layer 140. As shown in the top view of FIG. 6D, in this example, the opening 505 forms a rectangular ring around the active region of the BST capacitor. In alternative examples, however, other lateral shapes are possible; for example, the opening may not form a complete ring or it may take the shape of a different polygon.

Figure 6E:
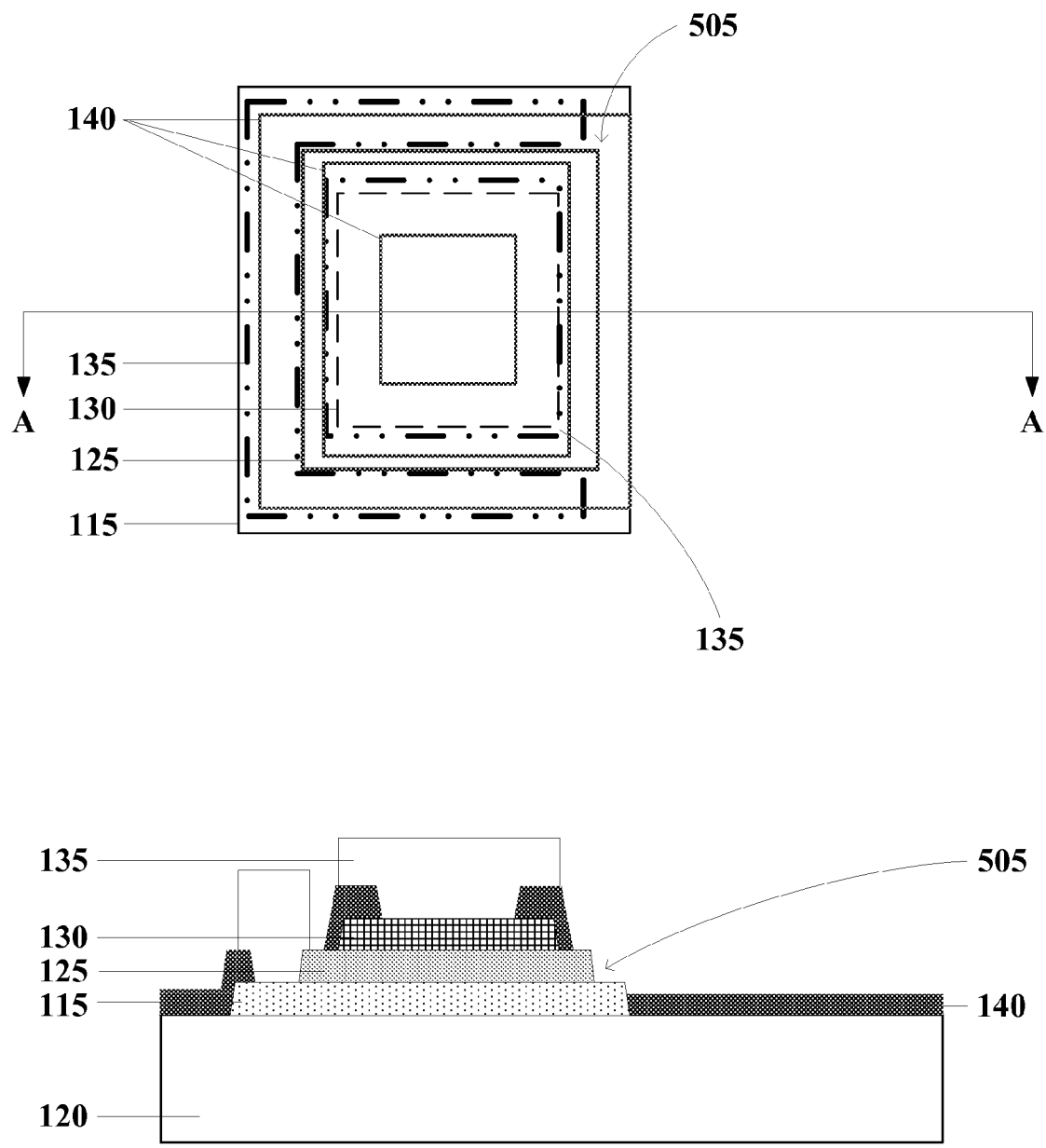

Referring to FIG. 6E, the conductive layer 135 is formed to contact the top electrode 130 and the bottom electrode 115. The conductive layer may be, for example, gold, which provides a low resistance electrical contact to the electrodes 115, 130. It is advantageous to place the conductive layer 135 in close proximity to the active region of the BST capacitor to reduce the overall resistance resulting from the platinum electrodes 115, 130. In this example, the gold may be patterned, for example, using a lift off process, in which a photoresist layer is first deposited and patterned using standard photolithography techniques. The gold is then deposited over the photoresist, possibly after deposition of an adhesion layer. Removing the photoresist layer leaves the patterned conductive layer 135. Alternatively, the gold may be deposited before the patterned photoresist layer and then wet etched using an iodine-based gold etchant that attacks gold but not BST or platinum.

Figure 6F:
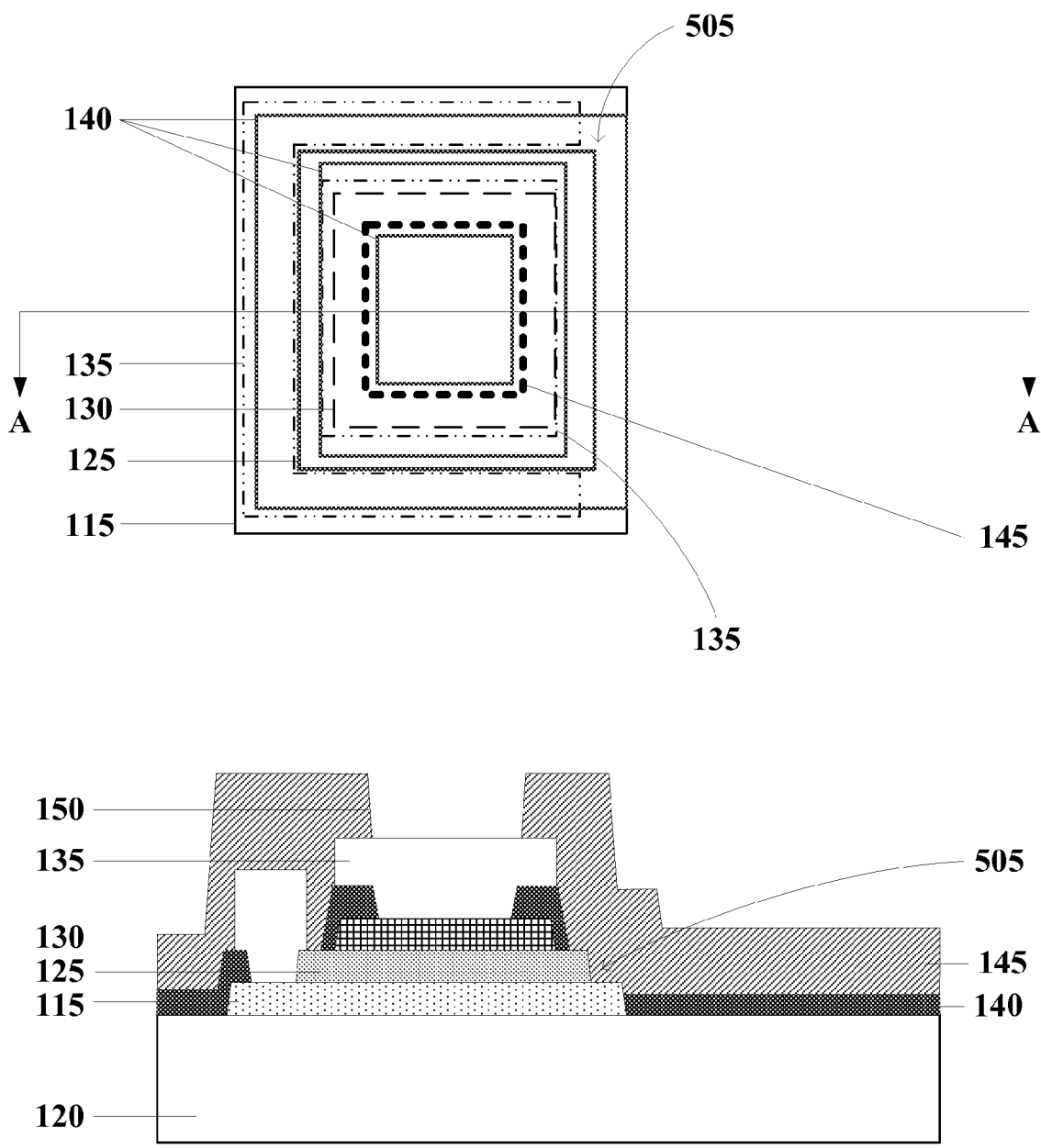

Referring to FIG. 6F, the second passivation layer 145 is then deposited and dry etched. The second passivation layer 145 may be, for example, a polyimide. In particular, the passivation layer 145 passivates regions of the BST thin film dielectric layer 125 and the bottom electrode 115 exposed in the opening 505.

Figure 6G:
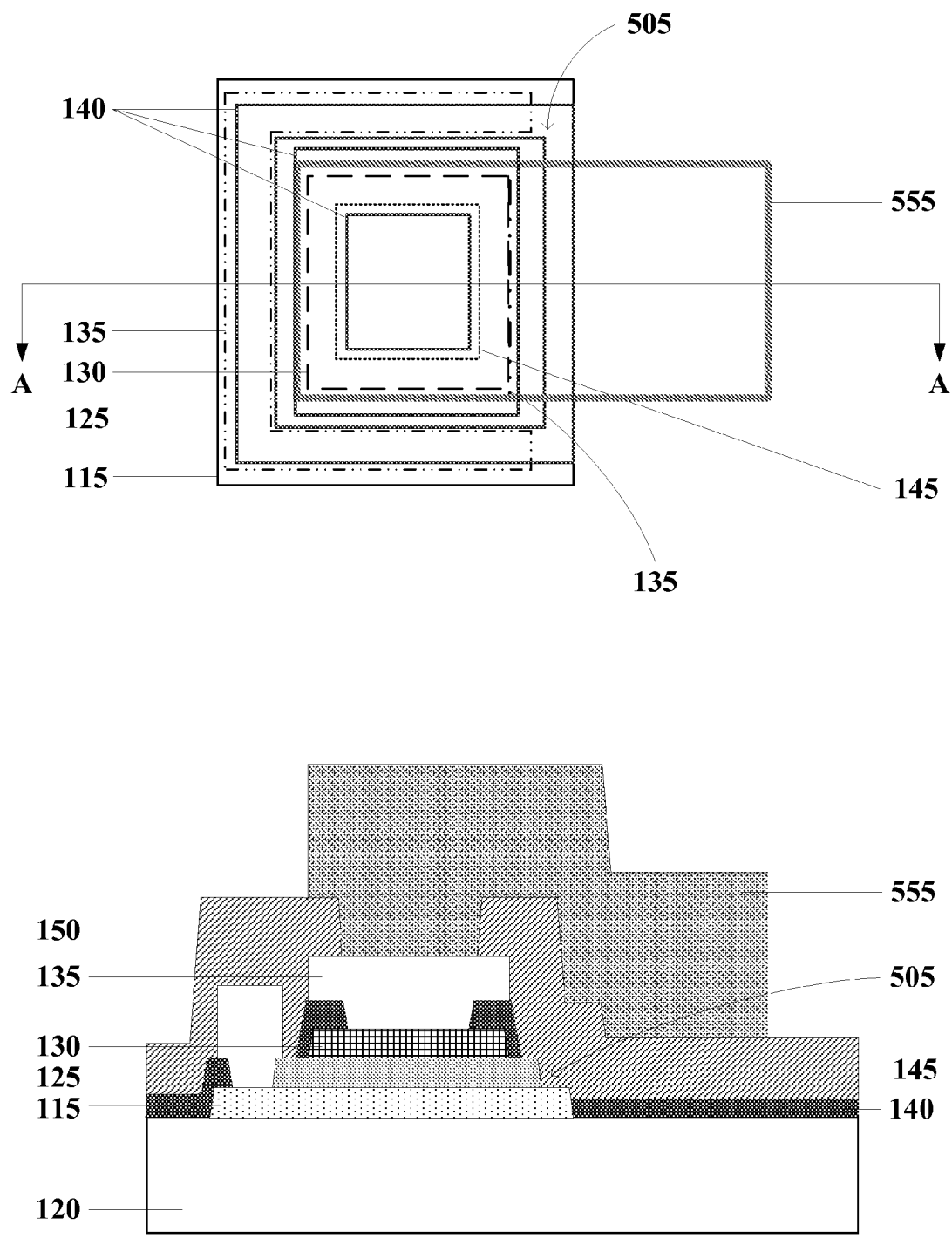

Referring to FIG. 6G, the conductive layer 555 is then formed to produce metal wiring to provide contact to the BST capacitor. In this example, the conductive layer 555 is gold, which may be deposited on the surface by electroplating. If necessary, the gold may be patterned using standard photolithography and etch techniques, for example, a wet etch.

Figure 6H:
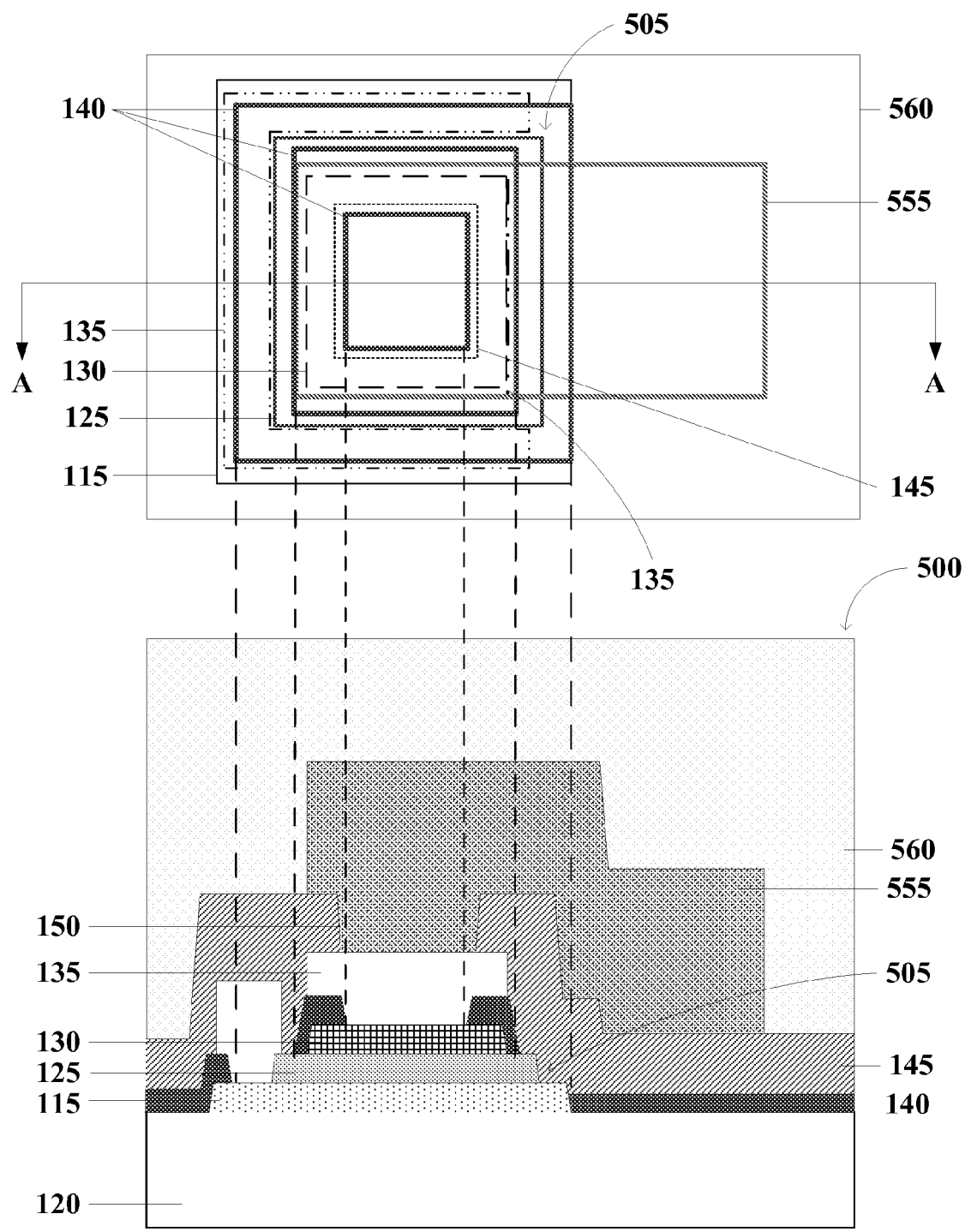

Referring to FIG. 6H, the third passivation layer 560 is deposited over the entire structure to protect the BST capacitor 500. The third passivation layer 560 may be, for example bisbenzocyclobutene (BCB). During the above processes, standard annealing techniques typically are used to improve the quality of the BST materials, for example, by repairing damage that may have occurred during the BST processing steps. Annealing can also improve the quality of the interfaces between the BST thin film dielectric layer 125 and the electrodes 115, 130.

Figure 7:
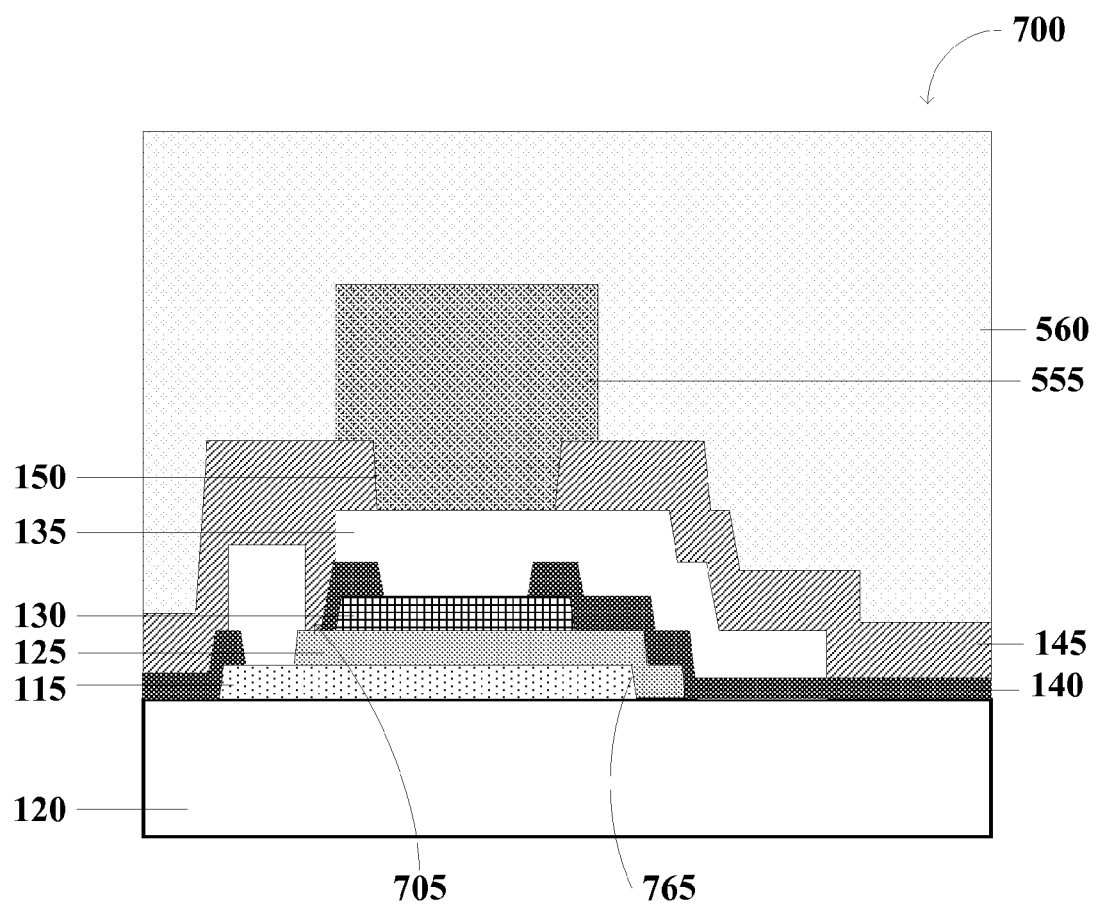
FIG. 7 is a cross-sectional view of a BST capacitor including a passivation structure in accordance with another embodiment of the present invention.

FIG. 7 is a cross-sectional view of a BST capacitor 700 including a passivation structure in accordance with another embodiment of the present invention. The BST capacitor 700 is similar to the BST capacitor 500 of FIG. 5, including many similar layers, which are numbered as in FIG. 5. While identical numbers in FIGS. 5 and 7 indicate a common layer, however, the lateral configuration of that layer may not be the same in FIGS. 5 and 7. For example, in the embodiment shown in FIG. 7, the BST thin film dielectric layer 125 extends beyond an edge 765 of the bottom electrode 115 and extends along a portion of the surface of the substrate 120. This lateral configuration of the dielectric layer 125 prevents the passivation layer 140 from contacting the bottom electrode 115 along the edge 765 of the bottom electrode 115. This prevents formation of the leakage path between the top electrode 130 and the bottom electrode 115 along the edge 765 of the bottom electrode 115. As a result, an opening 705 in the embodiment of FIG. 7 has a different lateral configuration than the opening 505 of FIG. 5. In particular, the opening 705 is located primarily in areas where leaving the passivation layer 140 would otherwise create the leakage path between the top electrode 130 and the bottom electrode 115 along the interface of the BST thin film dielectric layer 125. As shown in FIG. 7, the opening 705 is located where conductive layer 135 contacts bottom electrode 115, so that the edge of the BST thin film dielectric layer 125 is exposed to the second passivation layer 145 and to the conductive layer 135.

FIGS. 8A-8H are top view and cross-sectional view pairs, illustrating another exemplary fabrication process for BST parallel plate capacitors in accordance with the present invention. As with FIGS. 6A-6H, each individual figure shows a different phase of fabrication, while the sequence of figures shows the overall fabrication process. Each figure shows both a top view and a corresponding cross-sectional view, through the line A-A, of the capacitor during fabrication. The fabricated capacitor is shown in the last figure of the sequence. In the top view of each figure, the layer currently being processed is shown in a heavy weight line, except for the last figure of the sequence, which shows the first passivation layer in a heavy weight line. While the process described in FIGS. 8A-8H illustrates fabrication of the BST capacitor 700 of FIG. 7, the process may also be used to fabricate other BST capacitors, such as the BST capacitor 500 of FIG. 5.

Figure 8A:
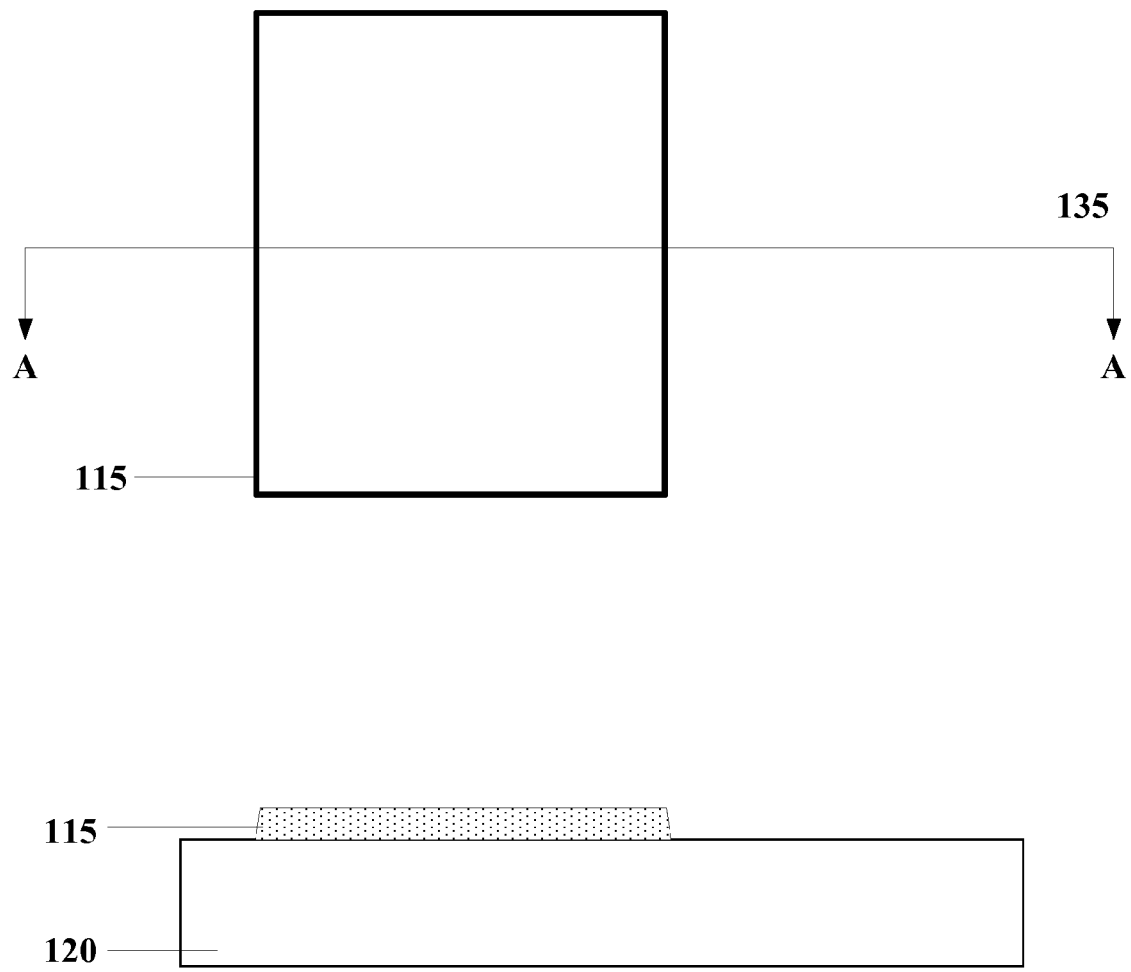
FIGS. 8A-8H are top view and cross-sectional view pairs, illustrating another exemplary fabrication process for BST parallel plate capacitors in accordance with the present invention.

Referring to FIG. 8A, the process begins with a substrate 120, which may be, for example, high-resistivity silicon (HR Si), crystalline sapphire ($Al_2O_3$), aluminum nitride (AlN), quartz, glass, or another substrate. These substrates are preferably polished for low surface roughness for compatibility with growth of smooth ferroelectric films with high breakdown fields. The bottom electrode 115 is formed on the substrate 120 using, for example, a lift off process in which a layer of photoresist is deposited on the substrate 120 and patterned using standard photolithography techniques. In one embodiment of the fabrication process, the bottom electrode 115 is a thin layer of platinum, which may be deposited over the photoresist lift off mask on the substrate 120 by sputtering or evaporation. A thin layer is preferred to minimize roughness during subsequent processing, while platinum provides compatibility with subsequent BST processing. Removal of the photoresist mask leaves the patterned bottom electrode 115 on the substrate 120. Alternatively, the thin layer of platinum can be deposited on the substrate 120 and subsequently patterned into the bottom electrode 115 using standard photolithography and etch techniques.

Figure 8B:
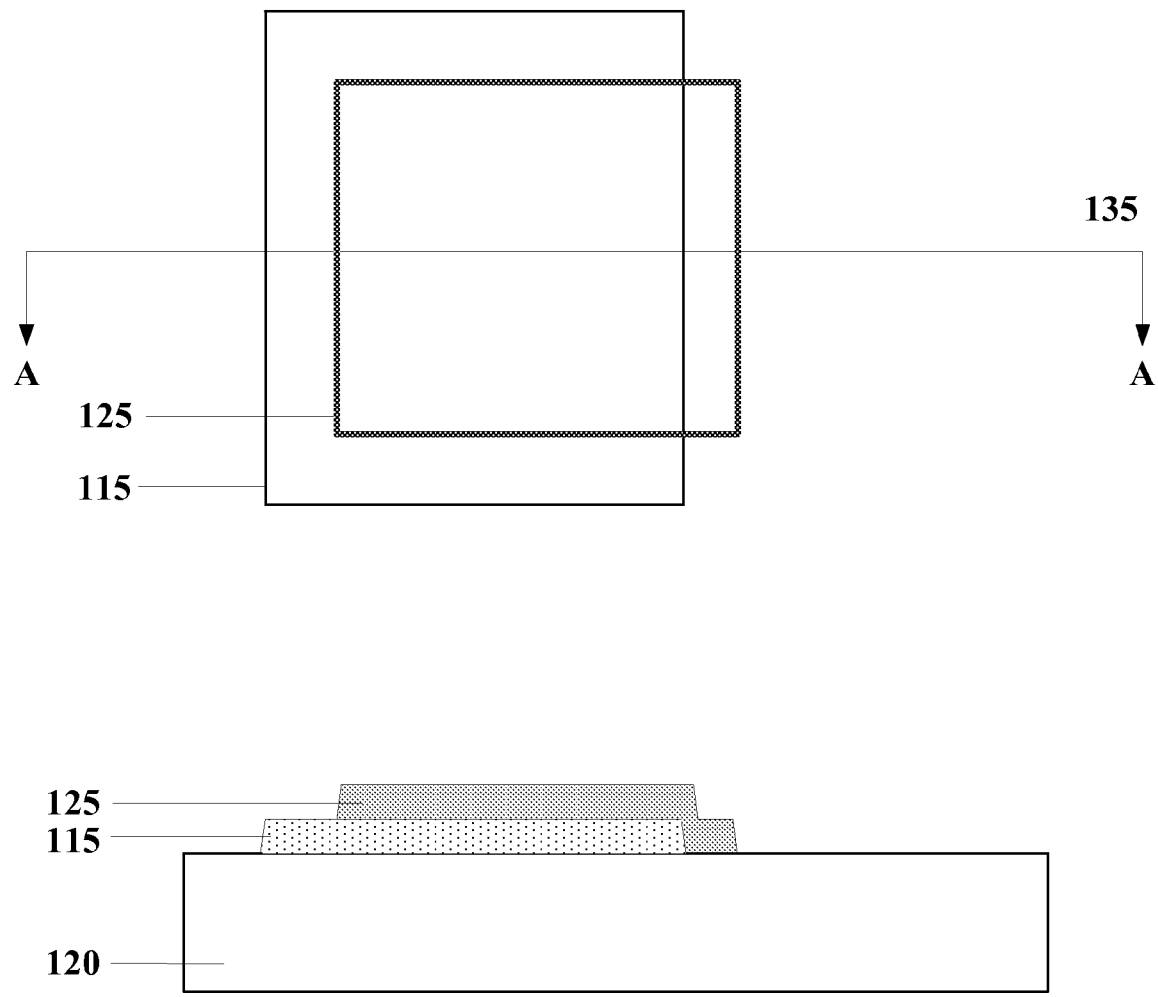

Referring to FIG. 8B, the BST thin film dielectric layer 125 is deposited over the bottom electrode 115 and etched using standard etch techniques. Specifically, a photoresist layer may be deposited and patterned using standard photolithography techniques to act as a wet etch mask. As discussed previously, the term "BST" refers to thin film dielectrics, for example, those composed of barium titanate, strontium titanate, and composites of the two, which may also include small concentrations of one or more dopants to modify certain properties.

Figure 8C:
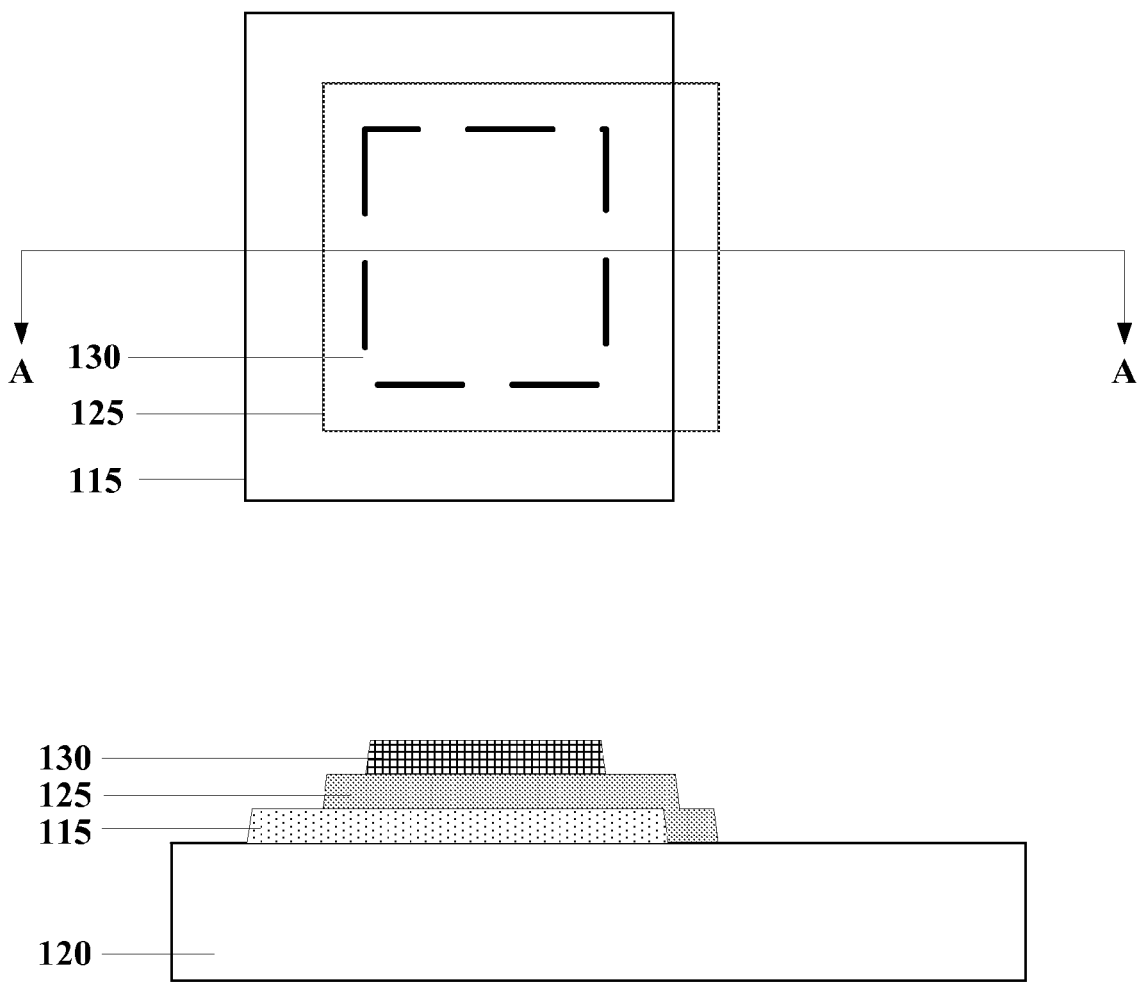

As shown in FIG. 8C, the top electrode 130 is formed overlying the BST thin film dielectric layer 125 and the bottom electrode 115. In this embodiment, the top electrode 130 may also be a thin layer of platinum. The top electrode 130 may be formed, for example using a lift off process, in which a layer of photoresist is deposited and patterned to act as a lift off mask. A conductive layer is then deposited over the lift off mask, for example, by evaporation or sputtering. Removal of the photoresist lift off mask leaves the patterned top electrode 130. Alternatively, the top electrode 130 may be formed using standard photolithography and etch techniques in which the conductive material is deposited prior to the patterned photoresist and selected portions of the conductive layer are etched away to form the lateral shape of the top electrode 130.

Figure 8D:
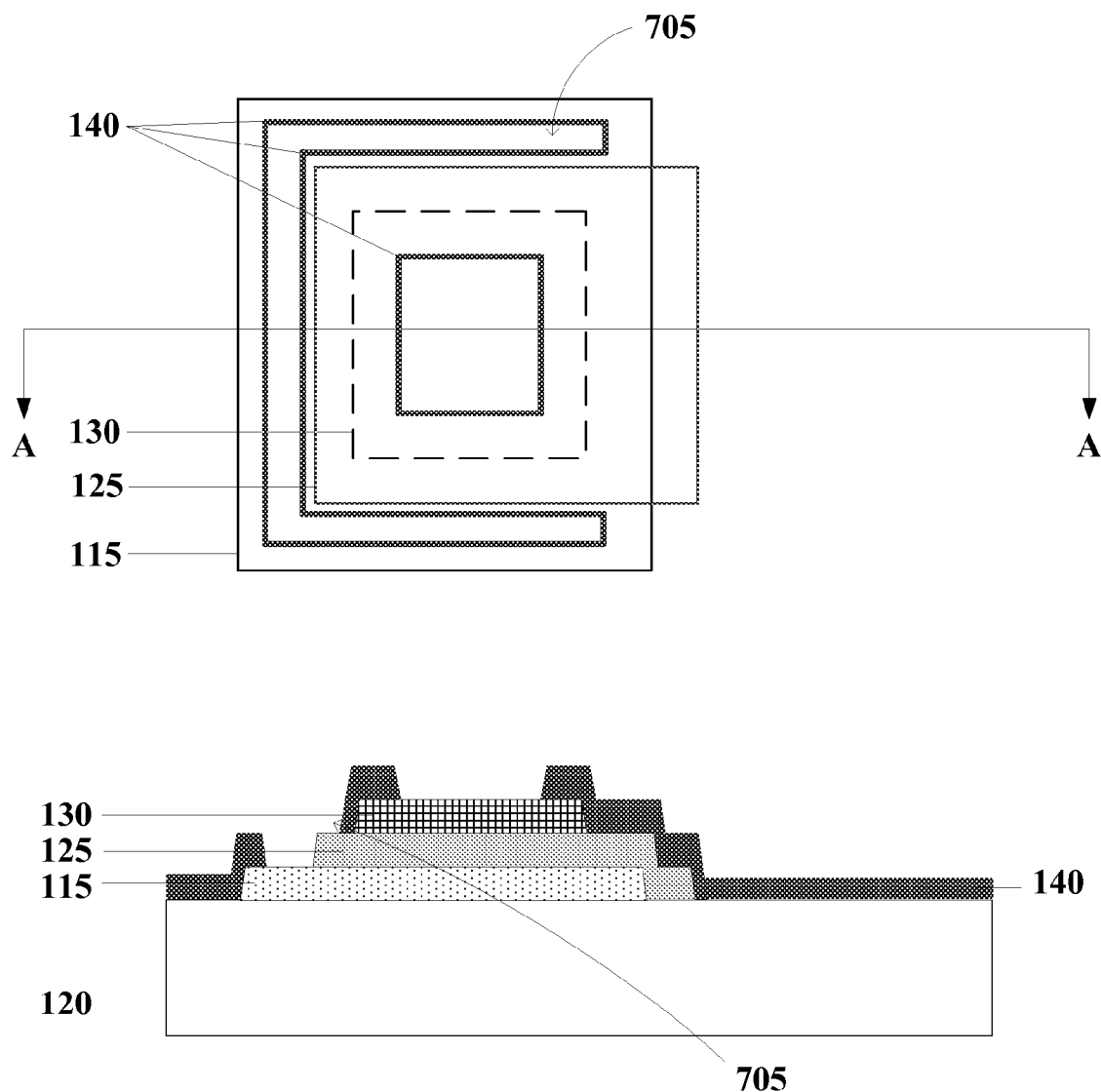

Referring to FIG. 8D, a passivation structure is then formed. In this example, the material for the first passivation layer 140 is silicon nitride, $Si_3N_4$, which is deposited over the structure and etched using standard photolithography and etch techniques, such as reactive ion etching. In particular, the $Si_3N_4$ layer is patterned to form a center opening to provide access to the top electrode 130. The $Si_3N_4$ layer is also patterned to form an opening 705 to break the leakage path that forms between the top electrode 130 and the bottom electrode 115 at the interface of the dielectric layer 125 and the passivation layer 140. As shown in the top view of FIG. 8D, in this example, the opening 705 includes three sides of a rectangular ring around the active region of the BST capacitor, i.e., the shape of a squared-off U. In alternative examples, however, other lateral shapes are possible, for example, the opening may form a complete ring or take the shape of a different polygon.

Figure 8E:
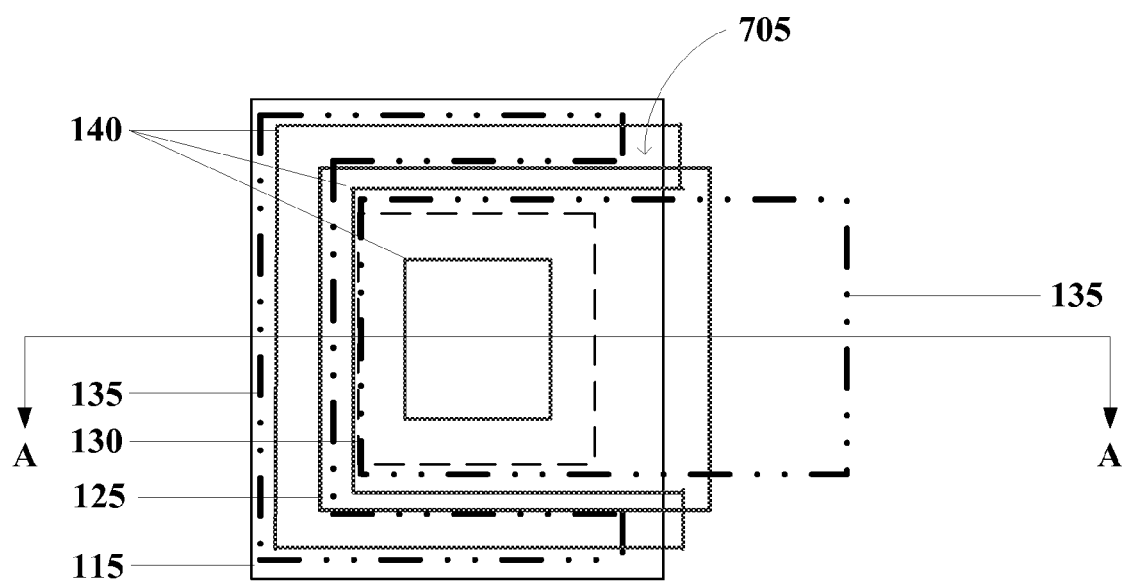
Figure 8E:
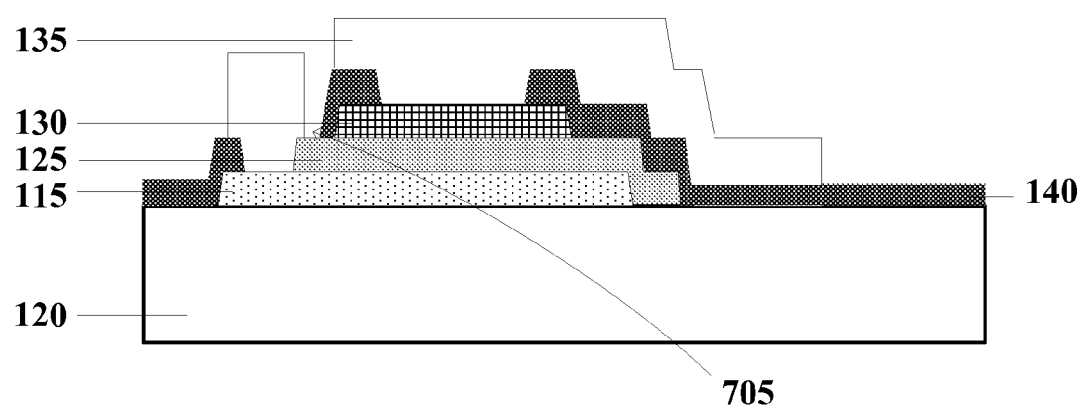

Referring to FIG. 8E, the conductive layer 135 is formed to contact the top electrode 130 and the bottom electrode 115. The conductive layer may be, for example, gold, which provides a low resistance electrical contact to the electrodes 115, 130. It is advantageous to place the conductive layer 135 in close proximity to the active region of the BST capacitor to reduce the overall resistance resulting from the platinum electrodes 115, 130. In this example, the gold may be etched, for example, using a lift off process, in which a photoresist layer is first deposited and patterned using standard photolithography techniques. The gold is then deposited over the photoresist, possibly after deposition of an adhesion layer. Removing the photoresist layer leaves the patterned conductive layer 135. Alternatively, the gold may be deposited before the patterned photoresist layer and then wet etched using an iodine-based gold etchant that attacks gold but not BST or platinum.

Figure 8F:
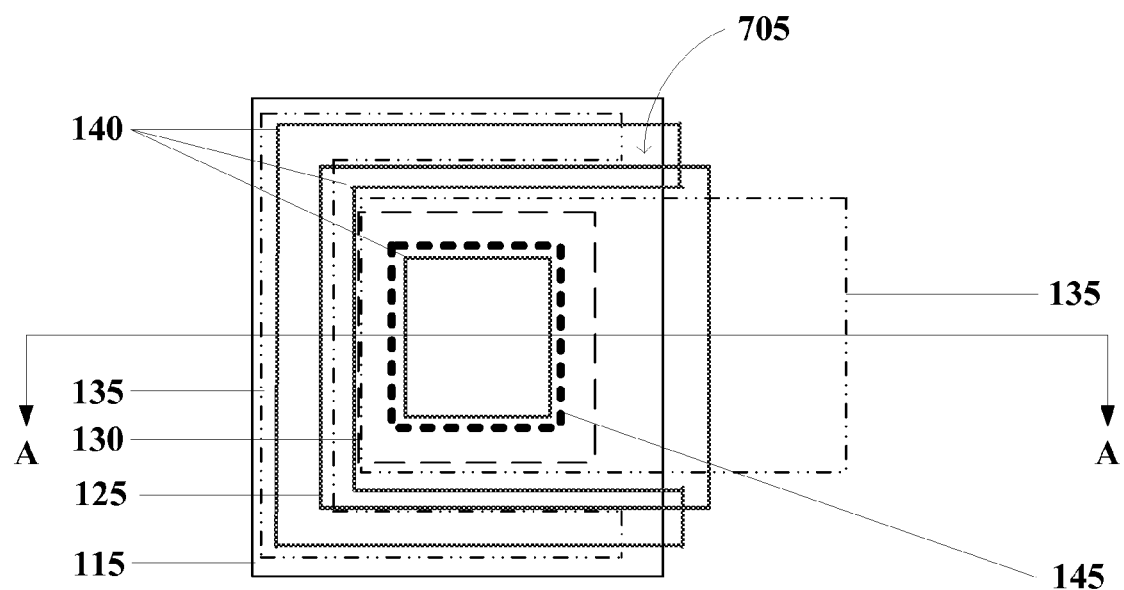
Figure 8F:
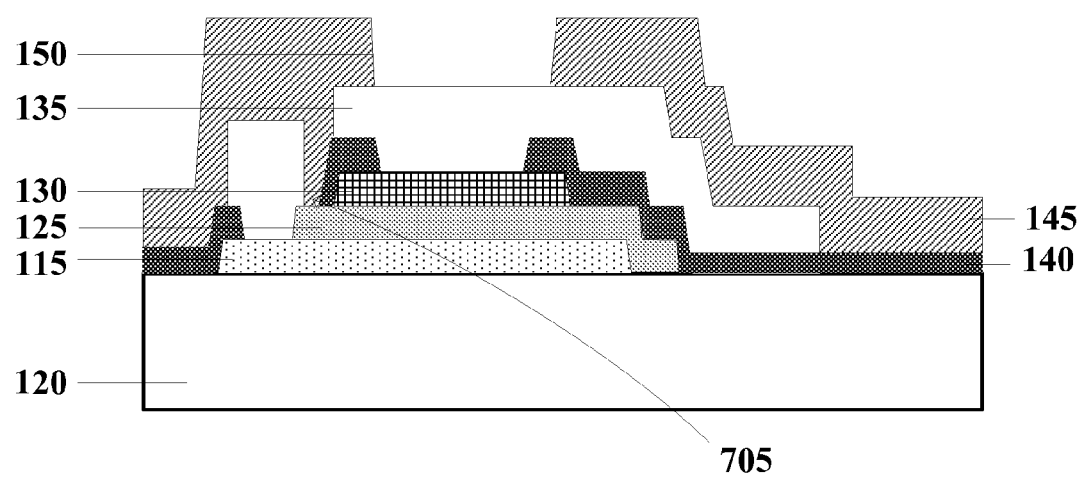

Referring to FIG. 8F, the second passivation layer 145 is then deposited and dry etched. The second passivation layer 145 may be, for example, a polyimide. In particular, the passivation layer 145 passivates regions of the BST thin film dielectric layer 125 and the bottom electrode 115 exposed in the opening 705.

Figure 8G:
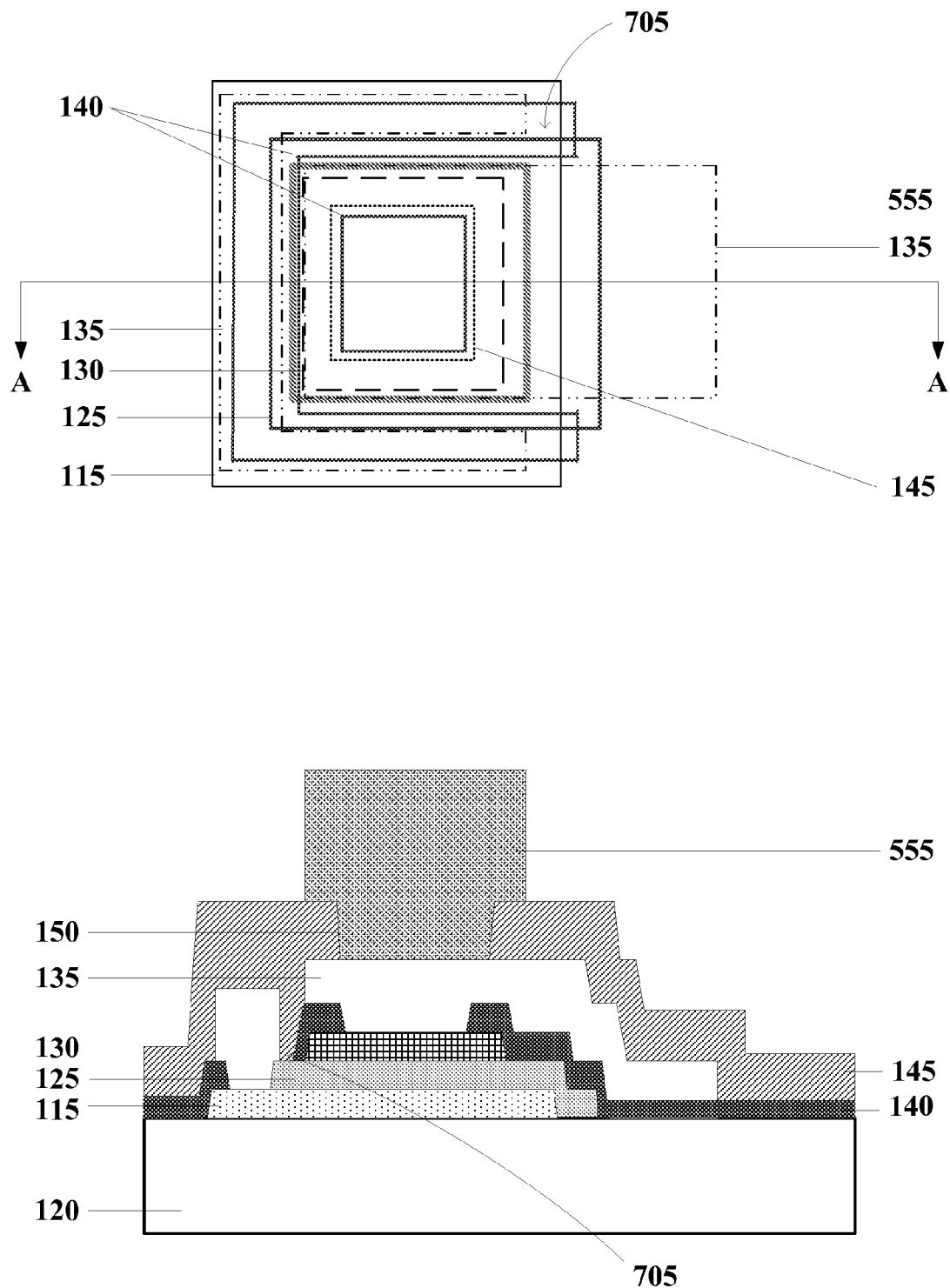

Referring to FIG. 8G, the conductive layer 555 is then formed to produce metal wiring to provide contact to the BST capacitor. In this example, the conductive layer 555 is gold, which may be deposited on the surface by electroplating. If necessary, the gold may be patterned using standard photolithography and etch techniques, for example, a wet etch.

Figure 8H:
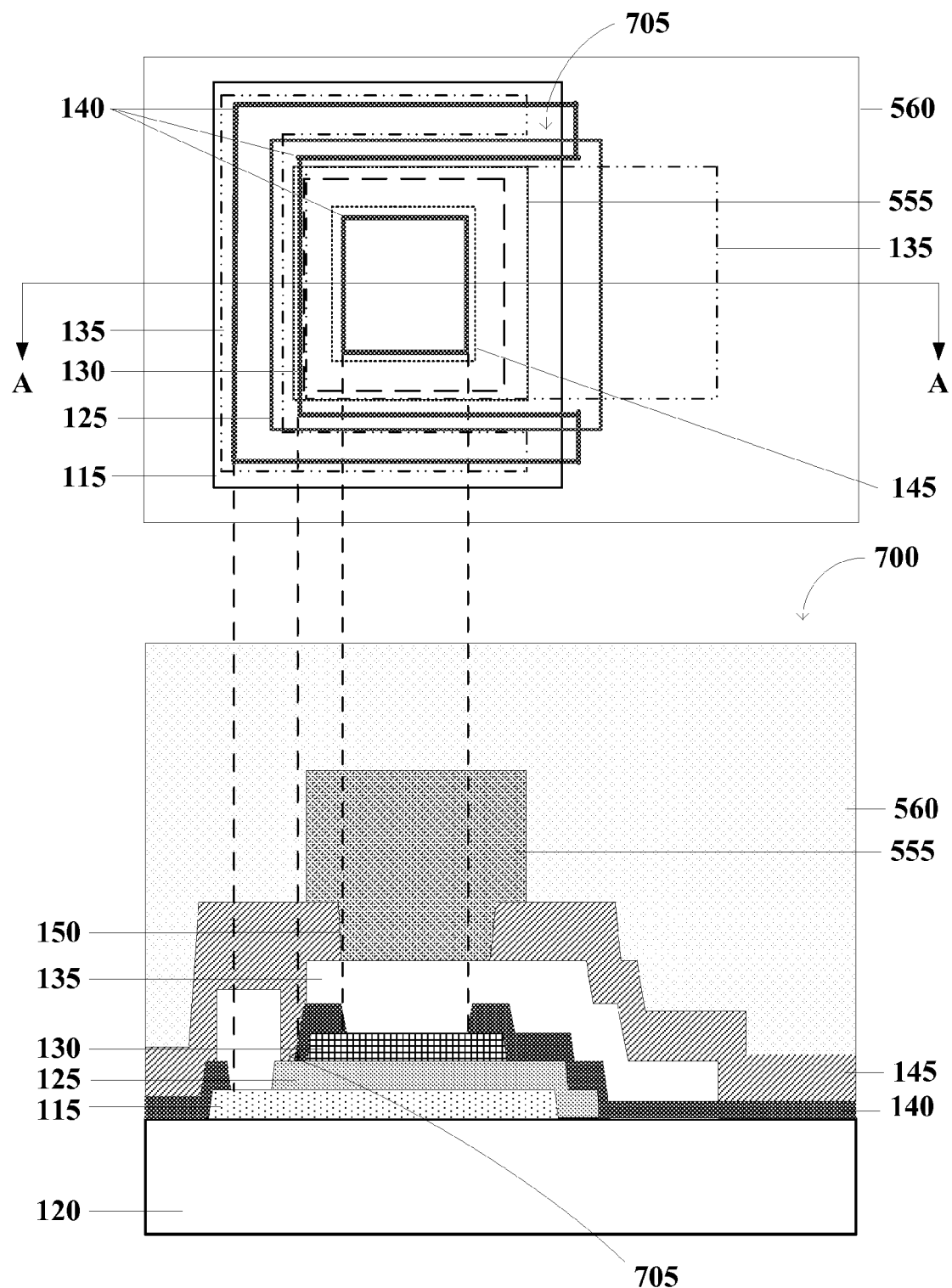

Referring to FIG. 8H, the third passivation layer 560 is deposited over the entire structure to protect the BST capacitor 700. The third passivation layer 560 may be, for example a layer of BCB. During the above processes, standard annealing techniques typically are used to improve the quality of the BST materials, for example, by repairing damage that may have occurred during the BST processing steps. Annealing can also improve the quality of the interfaces between the BST thin film dielectric layer 125 and the electrodes 115, 130.

Although embodiments with respect to parallel plate BST capacitors have been described in considerable detail, other embodiments will be apparent. In particular, the capacitors in FIGS. 2-8 are drawn with specific shapes for the electrodes 115, 130, the dielectric layer 125, and the openings 205, 505, 705 in the first passivation layer 140. However, this is not meant as a limitation since the specific geometries and shapes shown are not required. The figures are used to illustrate the passivation structure to break the leakage path between electrodes 115, 130 at the interface of the BST thin film dielectric layer 125 and the first passivation layer 140. Similar passivation structures, potentially of varying geometries, can be applied to parallel plate capacitors of different shapes. For example, the shapes of the top and bottom electrodes can be reversed, essentially turning the capacitor design upside down on the substrate. As another example, the structures can be curved in shape, for example circular, semicircular or serpentine. There can be different amounts of overlap between the structures. As another example, the principles described above apply also to arrays of capacitors. In particular, as a final example, the shapes of the openings in the passivation layer can be of various geometries, for example, complete rings around the active region, partial rings around the active region, rectangular rings, other polygonal rings, circular rings, and others.

Furthermore, the figures show the most relevant structures of the capacitor, but this does not imply that other structures or layers do not exist. For example, additional layers located between those shown may be used for various purposes according to conventional techniques. Examples include layers to increase adhesion, to provide a diffusion barrier, or to improve the Schottky barrier height. As another example, the bottom electrode 115 is always shown as supported directly by the substrate 120. This is for convenience, and other layers or structures can be located between the bottom electrode 115 and the substrate 120. In addition, each layer 115, 125, 130 can also include one or more types of materials, although they are shown and described as single layers of material.

Furthermore, fabrication processes are not required to use all of the processing techniques discussed above. Various embodiments can use only some of the techniques. Similarly, techniques illustrated in one sequence of figures can be combined with techniques illustrated in another sequence of figures. For example, a particular step may be described as using a selective wet etch to form the lateral shape of a structure. In alternate embodiments, a lift off process, dry etch, or other standard processes may be used instead.

Integrated Resistors

Figure 9A:
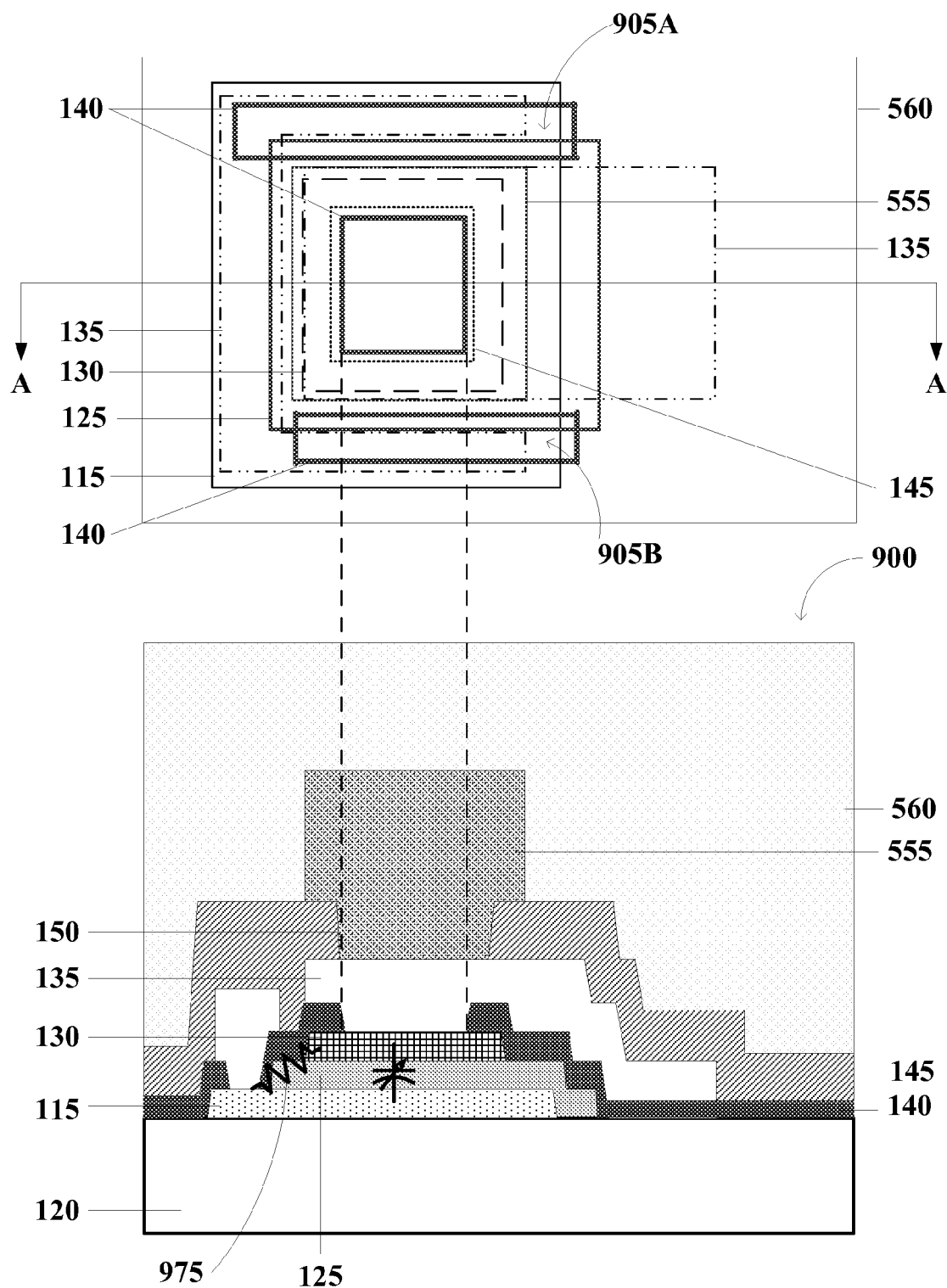
FIG. 9A is a top view and cross-sectional view pair of a BST capacitor including an integrated resistor resulting from a passivation structure in accordance with another embodiment of the present invention.

FIG. 9A is a top view and cross-sectional view pair of a BST capacitor 900 including an integrated resistor 975, symbolized by the overlaid resistor symbol, resulting from a passivation structure in accordance with another embodiment of the present invention. The figure shows both a top view and a corresponding cross-sectional view, through the line A-A. The BST capacitor 900 is similar to the BST capacitor 700 of FIG. 7, including many similar layers, which are numbered as in FIG. 7. While identical numbers in FIGS. 7 and 9A indicate a common layer, however, the lateral configuration of that layer may not be the same in FIGS. 7 and 9A. For example, in the cross-sectional view of the embodiment shown in FIG. 9A, the integrated resistor 975 is formed because a portion of the first passivation layer 140 contacts the dielectric layer 125 providing a leakage path along the interface between layers 125, 140 from the top electrode 130 to the bottom electrode 115.

Openings 905A and 905B, similar in function to the opening 705 in FIG. 7, through the first passivation layer 140 appear only in the top view of FIG. 9A. The openings 905A, 905B interrupt the leakage path along the interface between layers 125, 140 by allowing the second passivation layer 145 to contact the dielectric layer 125. The shape and size of the openings 905A, 905B directly affect the value of the integrated resistor 975 since the openings 905A, 905B directly affect the area of the leakage path. Those of skill in the art will appreciate that the size, shape, and number of the openings 905A, 905B in FIG. 9A is for illustrative purposes only. The size, shape, and number of the openings 905A, 905B can be varied to effect a wide variety of values for the integrated resistor 975.

Figure 9B:
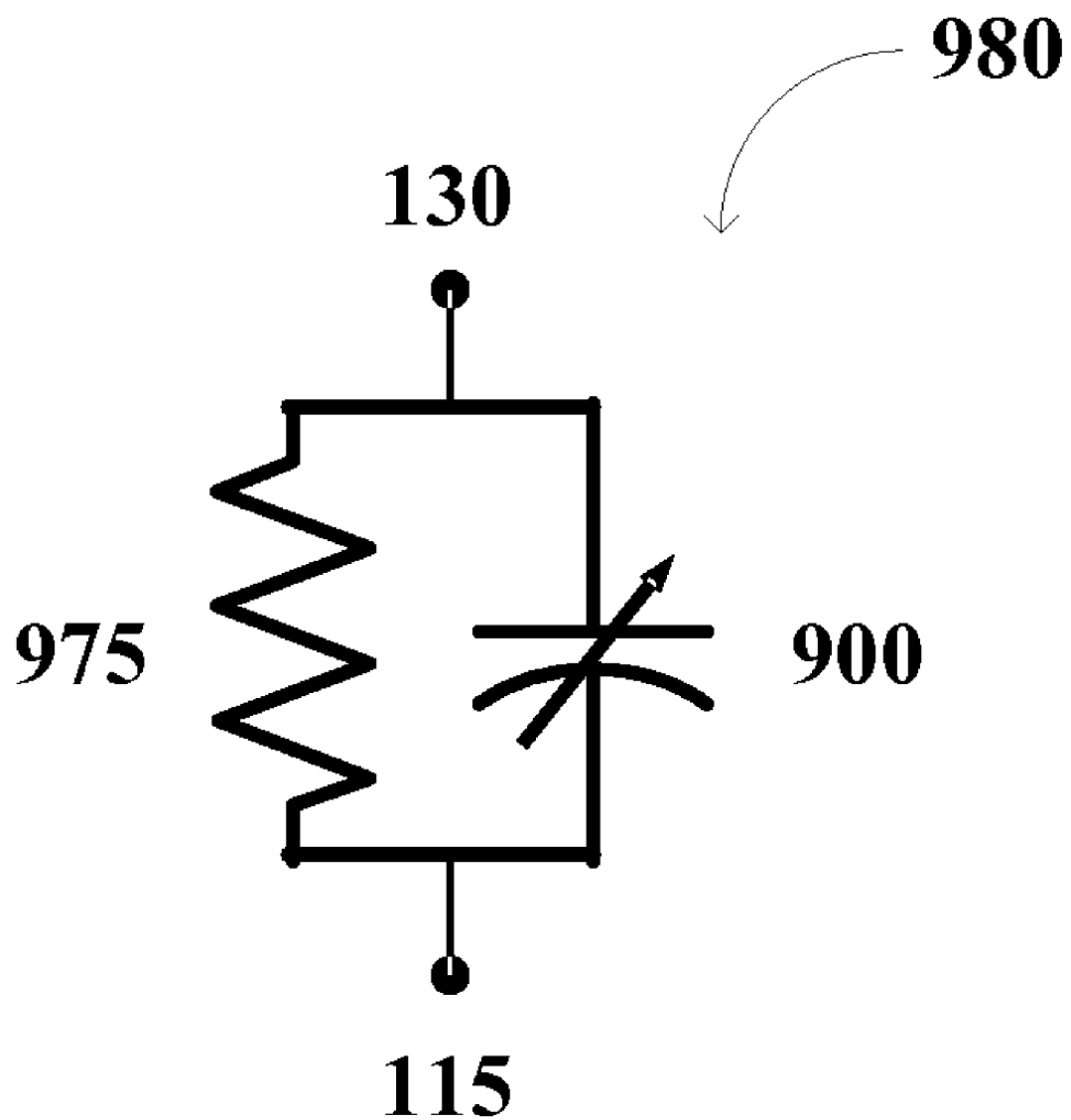
FIG. 9B is one embodiment of a circuit diagram modeling the BST capacitor of FIG. 9A.

FIG. 9B is a circuit diagram 980 modeling the BST capacitor 900 of FIG. 9A. The circuit diagram 980 shows the BST capacitor 900 coupled in parallel with the integrated resistor 975. The BST capacitor 900 and its integrated resistor 975 may be fabricated using a process such as that shown in FIGS. 8A-8H.

Figure 10A:
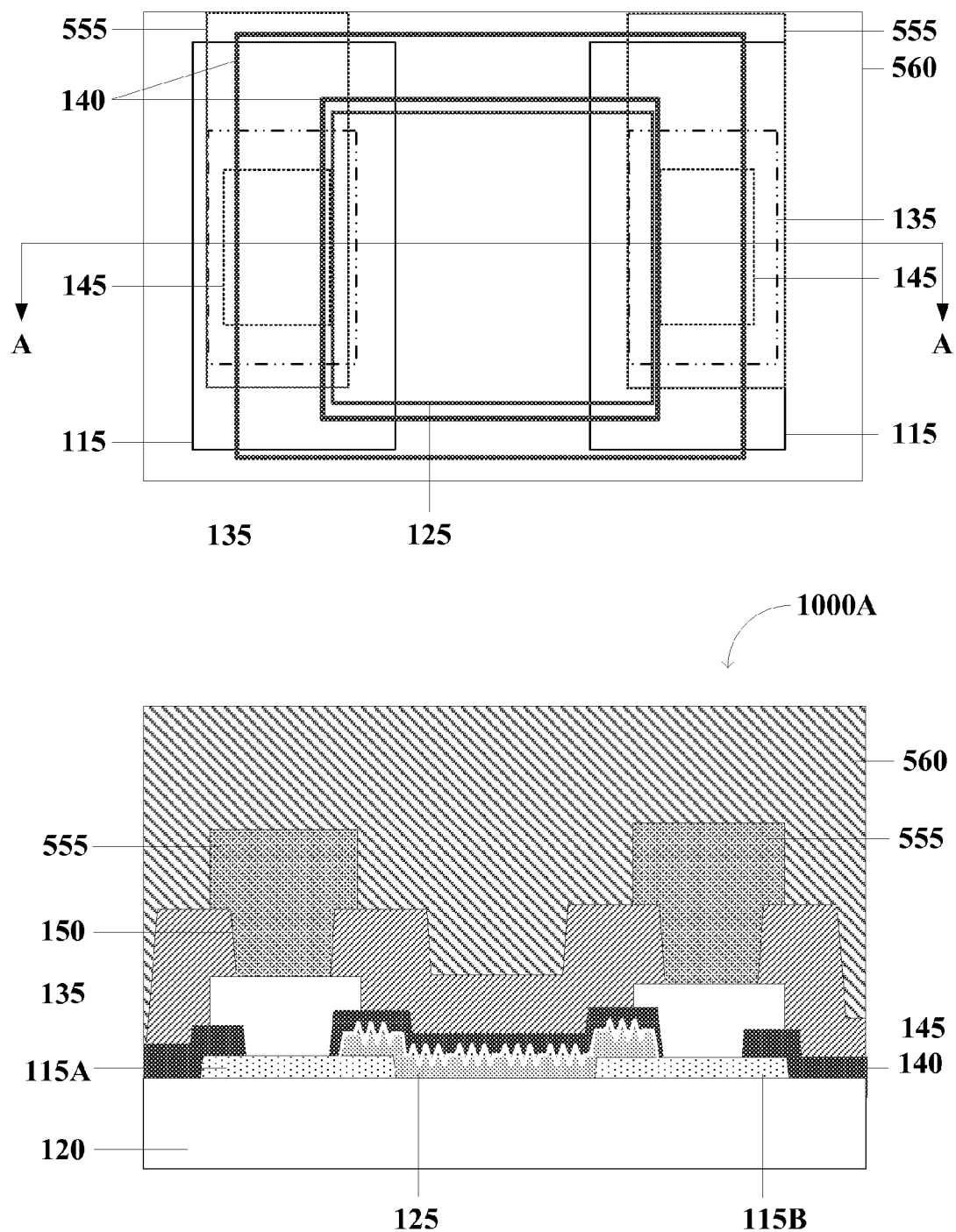
FIGS. 10A and 10B are top view and cross-sectional view pairs of exemplary integrated resistors formed using a passivation structure in accordance with the present invention.
Figure 10B:
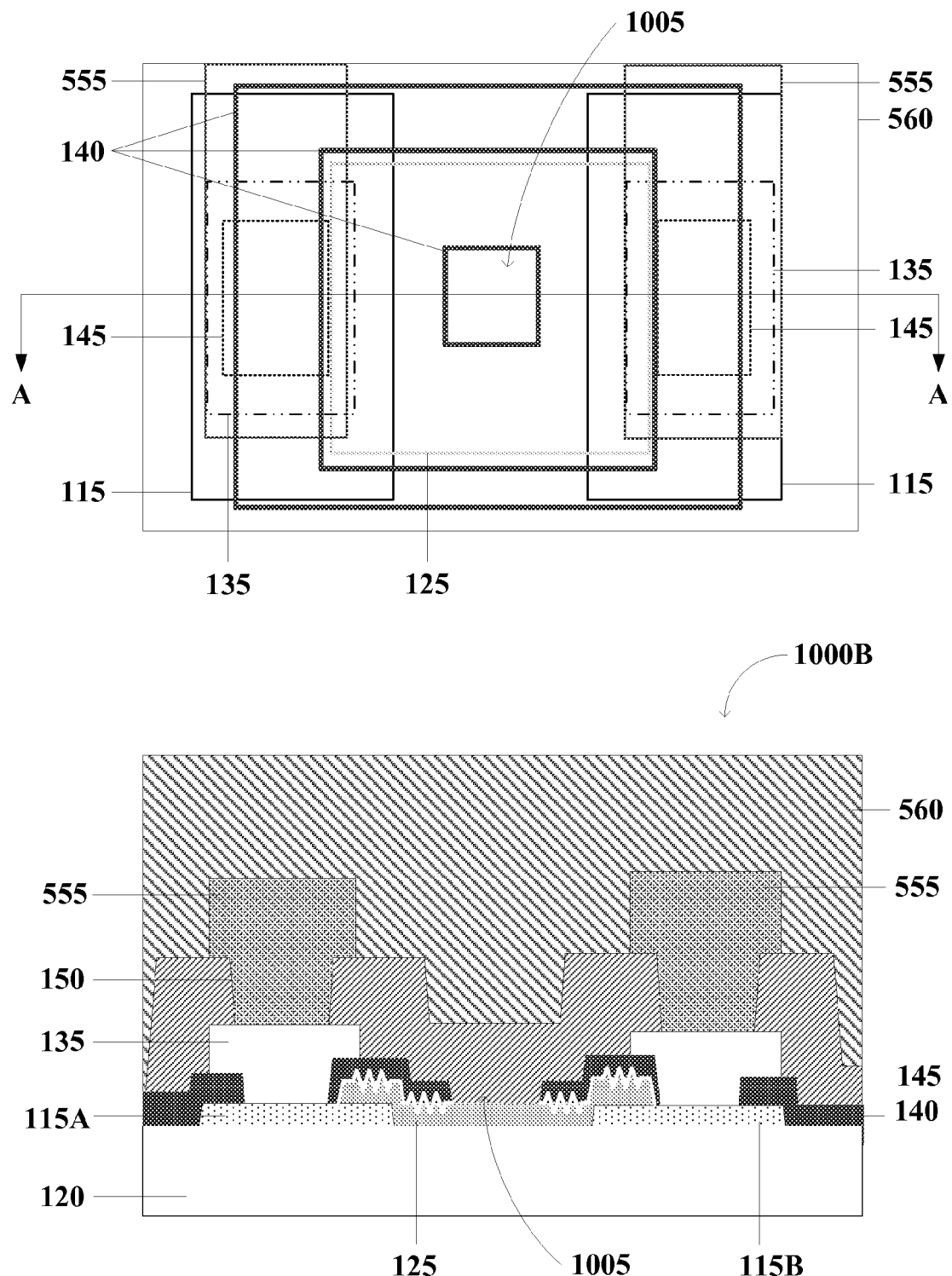

FIGS. 10A and 10B are top view and cross-sectional view pairs of exemplary integrated resistors 1000A, 1000B formed using the passivation structure in accordance with embodiments of the present invention. Each figure shows both a top view and a corresponding cross-sectional view, through the line A-A. The integrated resistors 1000A, 1000B include many layers similar to the BST capacitor 500 of FIG. 5 that are numbered as in FIG. 5. While identical numbers in FIGS. 5 and 10A and 10B indicate a common layer, however, the lateral configuration of that layer may not be the same in FIGS. 5 and 10A and 10B. The integrated resistors 1000A, 1000B may be fabricated, for example, using a process similar to that described in FIGS. 8A-8H.

The integrated resistors 1000A, 1000B are formed between electrodes 115A, 115B, which are formed from the same material as the bottom electrode 115 of FIG. 5. The integrated resistors 1000A, 1000B are formed at the interface between the dielectric layer 125 and the first passivation layer 140, as indicated by the overlaid resistor chains. The values of the integrated resistors 1000A, 1000B depend on the respective areas of the interfaces. In the case of the integrated resistor 1000A of FIG. 10A, the area of the interface is related to the innermost square of the first passivation layer 140 as seen in the top view. In the case of the integrated resistor 1000B of FIG. 10B, the area of the interface has been modified by creating an opening 1005 through the first passivation layer 140 allowing the second passivation layer 145 to contact the dielectric layer 125, thereby interrupting the leakage path along the interface between the dielectric layer 125 and the first passivation layer 140 between electrodes 115A, 115B. Those of skill in the art will appreciate that the configuration of the layers comprising the integrated resistors 1000A, 1000B are merely illustrative and a variety of integrated resistors may be fabricated by varying the lateral shape of the first passivation layer 140 as well as the size and shape of any openings 1005 through the first passivation layer 140.

Gap Capacitors

Figure 11A:
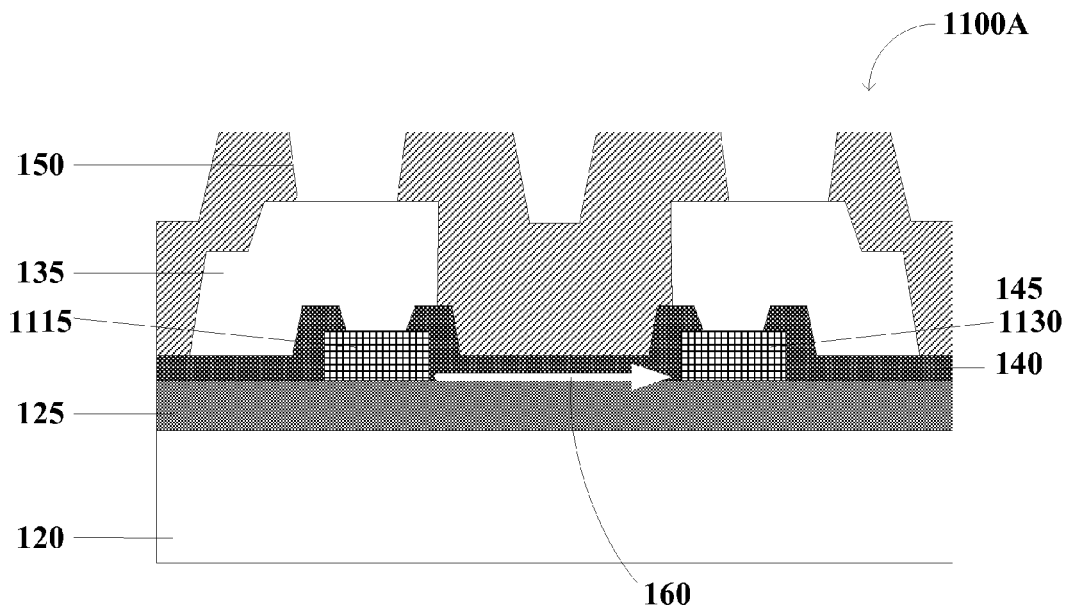
FIG. 11A is a cross-sectional view of a conventional BST gap capacitor fabricated using semiconductor process technology including a conventional passivation scheme.

FIG. 11A is a cross-sectional view of a conventional BST gap capacitor 1100A fabricated using semiconductor process technology including a conventional passivation scheme. The BST gap capacitor 1100A includes several layers similar to the BST capacitors 200, 500, and 700 of FIGS. 2, 5, and 7. Such layers are numbered similarly as in FIGS. 2, 5, and 7. While identical numbers in FIG. 11A and FIGS. 2, 5, and 7 indicate common layers, the physical structure of BST gap capacitor 1100A is not the same as the parallel plate BST capacitors 200, 500, and 700 of FIGS. 2, 5, and 7.

In particular, the BST gap capacitor 1100A includes a blanket BST thin film dielectric layer 125. As discussed previously, the BST thin film dielectric layer 125 may include barium titanate, strontium titanate, and composites of the two. A first electrode 1115 and a second electrode 1130 are formed from the same layer of conductive material, for example, platinum. A first passivation layer 140, for example, $Si_3N_4$, overlies and protects the first electrode 1115, the dielectric layer 125, and the second electrode 1130. The additional conductive layer 135 forms a low resistance contact to the electrodes 1115, 1130. The second passivation layer 145 protects the entire structure and includes openings 150 to allow electrical contact to the BST gap capacitor 1100A.

As with the conventional parallel plate BST capacitor 105 of FIG. 1, a major drawback to conventional passivation of the BST gap capacitor 1100A, is the formation of the leakage path 160 along the interface of the dielectric layer 125 and the first passivation layer 140, as shown in FIG. 11A. This leakage path 160 between the first electrode 1115 and the second electrode 1130 can be undesirable for power efficiency and reliability, particularly if it is uncontrolled.

Figure 11B:
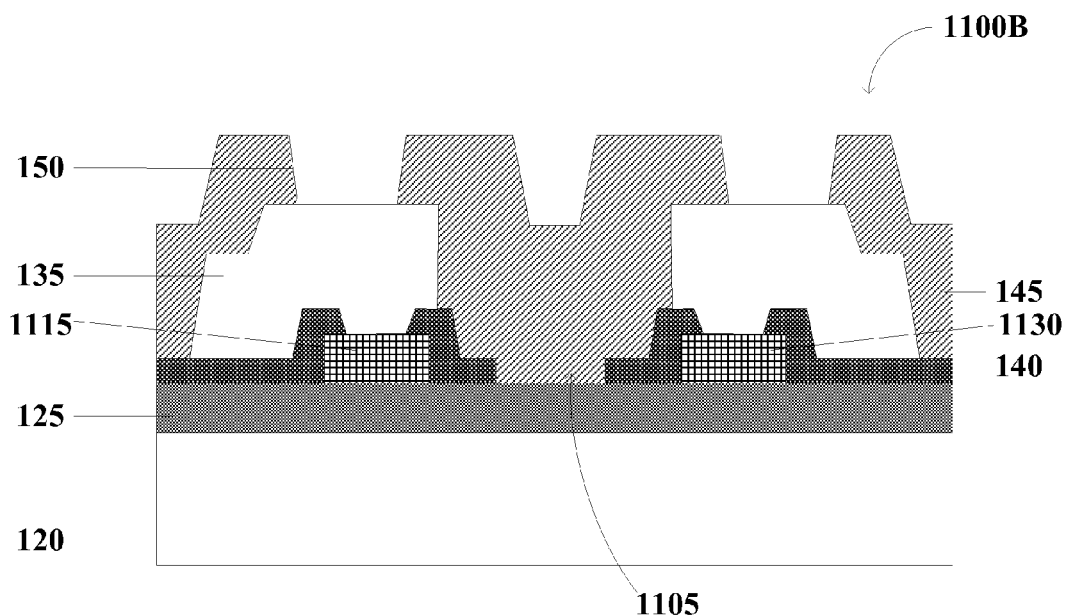
FIG. 11B is a cross-sectional view of a BST gap capacitor including a passivation structure in accordance with one embodiment of the present invention.

FIG. 11B is a cross-sectional view of a BST gap capacitor 1100B including a passivation structure in accordance with one embodiment of the present invention. Similar reference numerals in FIGS. 11A and 11B refer to similar structures. The BST gap capacitor 1100B, however, also includes an opening 1105 in the first passivation layer 140 that operates to break the leakage path 160 of FIG. 11A.

FIGS. 12A-12D are top view and cross-sectional view pairs, illustrating an exemplary embodiment of a fabrication process for the BST gap capacitor 1100B of FIG. 11B in accordance with the present invention. As with FIGS. 6A-6H, each individual figure shows a different phase of fabrication, while the sequence of figures shows the overall fabrication process. Each figure shows both a top view and a corresponding cross-sectional view, through the line A-A, of the capacitor during fabrication. The fabricated capacitor is shown in the last figure of the sequence. In the top view of each figure, the layer currently being processed is shown in a heavy weight line.

Figure 12A:
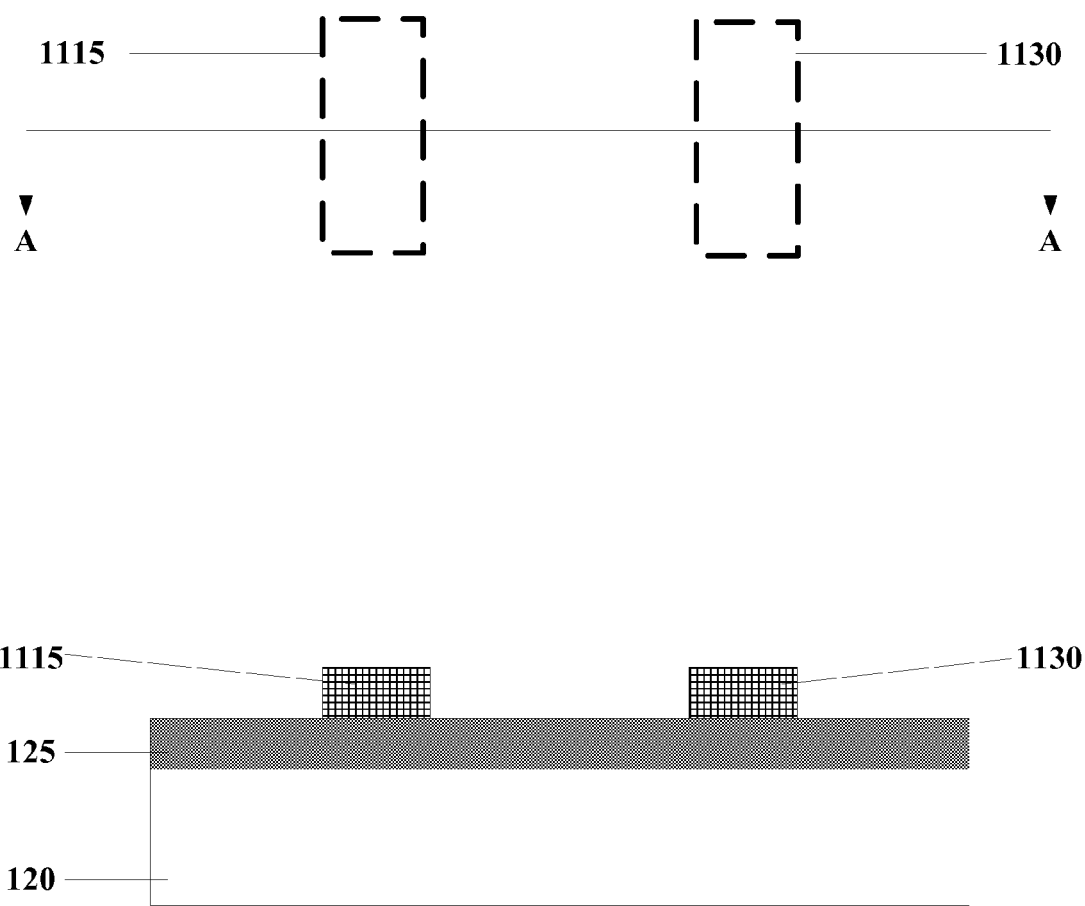
FIGS. 12A-12D are top view and cross-sectional view pairs, illustrating an exemplary embodiment of a fabrication process for the BST gap capacitor of FIG. 11B in accordance with the present invention.

Referring to FIG. 12A, the process begins with a substrate 120, which may be, for example, high-resistivity silicon (HR Si), crystalline sapphire ($Al_2O_3$), aluminum nitride (AlN), quartz, glass, or another substrate. These substrates are preferably polished for low surface roughness for compatibility with growth of smooth ferroelectric films with high breakdown fields. A blanket BST thin film dielectric layer 125 is grown or deposited over the substrate 120. As discussed previously, the term "BST" refers to thin film dielectrics, for example, those composed of barium titanate, strontium titanate, and composites of the two, which may also include small concentrations of one or more dopants to modify certain properties.

Still referring to FIG. 12A, the electrodes 1115, 1130 are formed in a conducting layer, which may be, for example, platinum, using standard photolithography and etch techniques to remove selected portions of the conducting layer to form the lateral shape of the electrodes 1115, 1130. Specifically, a layer of photoresist is deposited over the conducting layer and patterned to define the electrodes 1115, 1130. The exposed portions of the conducting layer are then etched away, for example, by ion milling.

Figure 12B:
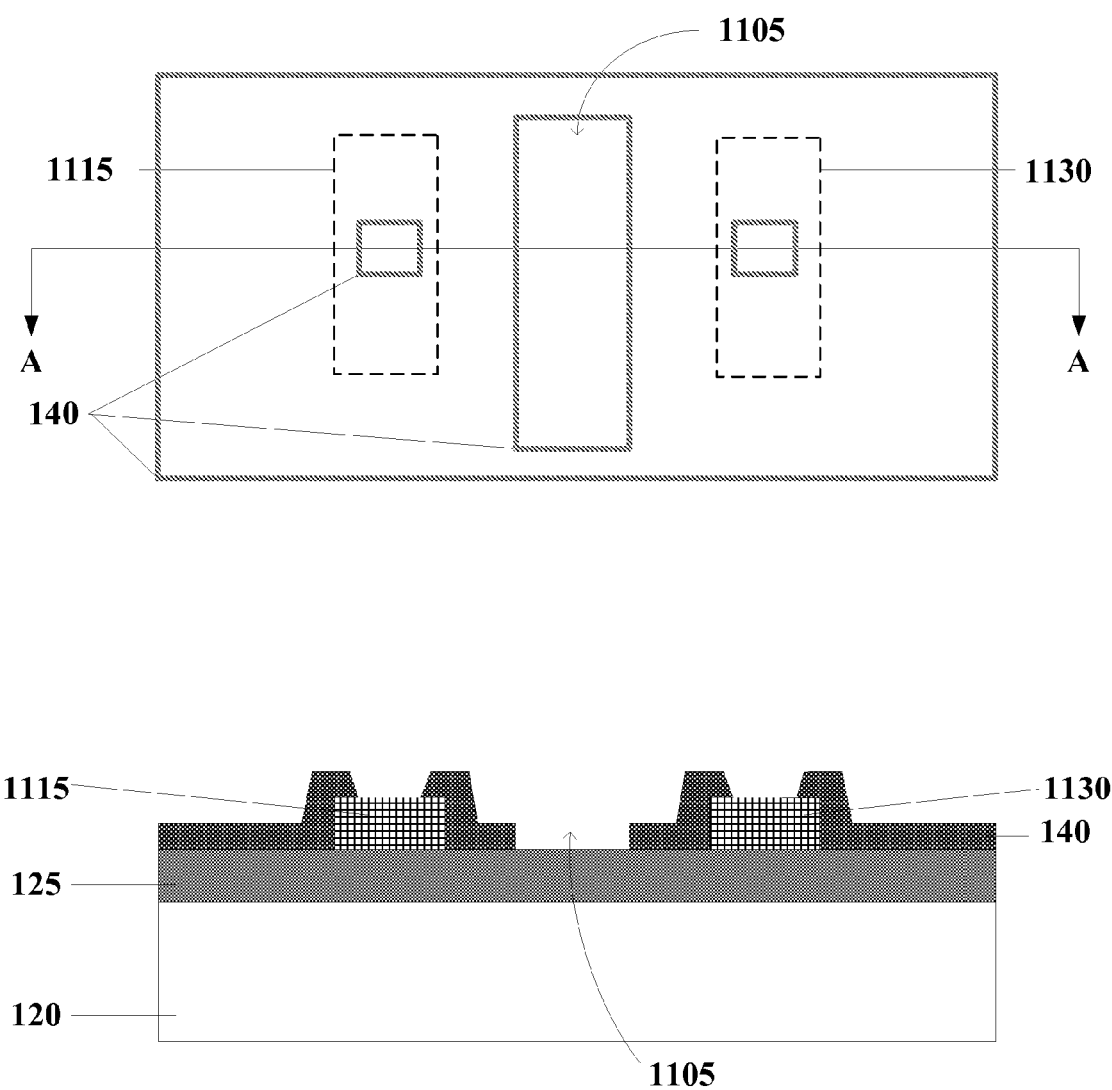

Referring to FIG. 12B, a passivation structure is formed. In this example, the material for the first passivation layer 140 is silicon nitride, $Si_3N_4$, which is deposited over the structure and etched using standard photolithography and etch techniques, such as reactive ion etching. In particular, the $Si_3N_4$ layer is patterned to form openings to provide access to the electrodes 1115, 1130. The $Si_3N_4$ layer is also patterned to form an opening 1105 to break the leakage path that forms between the electrode 1115 and the electrode 1130 at the interface of the dielectric layer 125 and the passivation layer 140. As shown in the top view of FIG. 12B, in this example, the opening 1105 forms a rectangle over the active region of the gap capacitor. In alternative examples, however, other lateral shapes are possible.

Figure 12C:
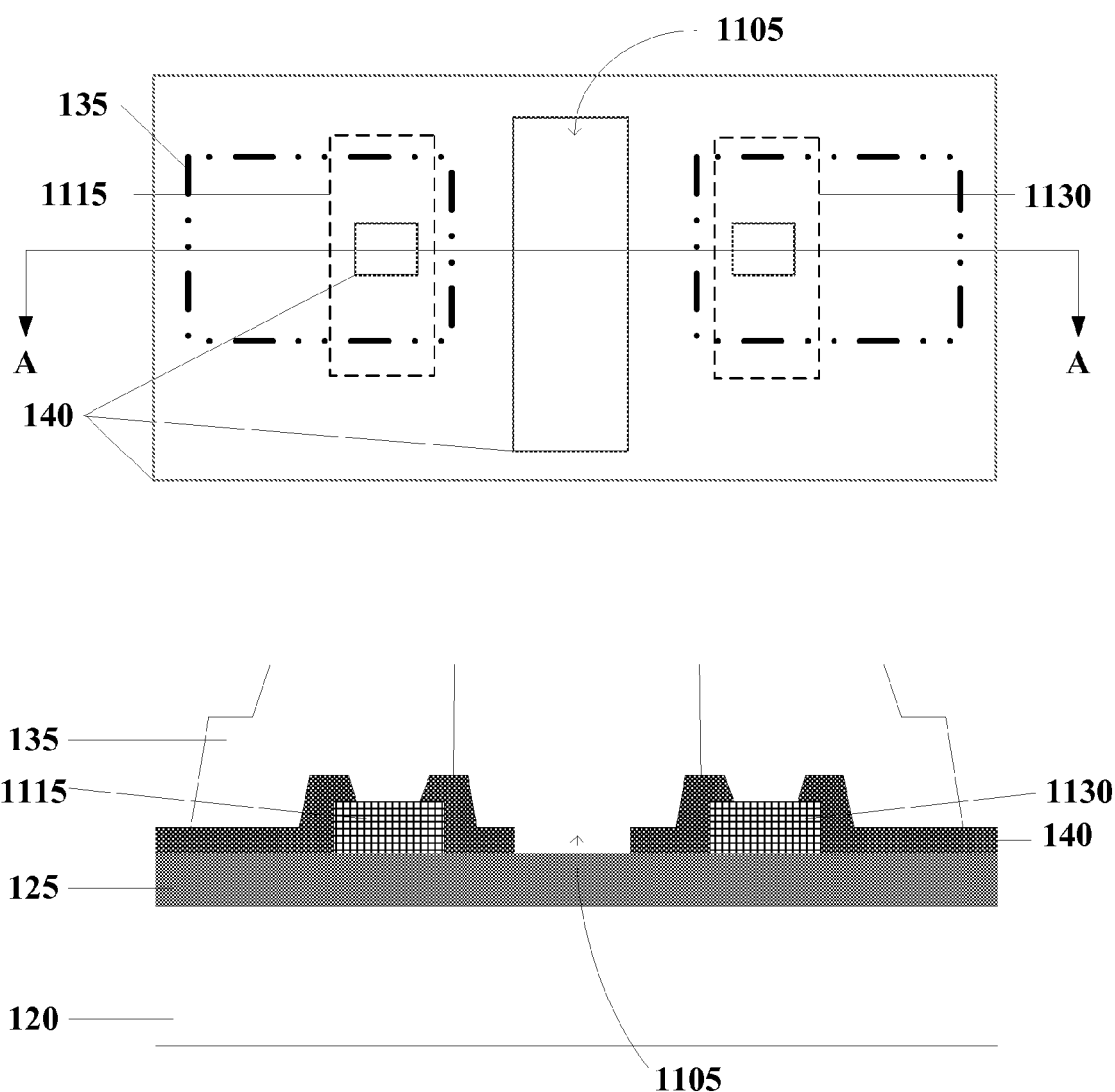

Referring to FIG. 12C, the conductive layer 135 is formed to contact the electrodes 1115, 1130. The conductive layer may be, for example, gold, which provides a low resistance electrical contact to the electrodes 1115, 1130. In this example, the gold may be etched, for example, using a lift off process, in which a photoresist layer is first deposited and patterned using standard photolithography techniques. The gold is then deposited over the photoresist, possibly after deposition of an adhesion layer. Removing the photoresist layer leaves the patterned conductive layer 135. Alternatively, the gold may be deposited before the patterned photoresist layer and then wet etched using an iodine-based gold etchant that attacks gold but not BST or platinum.

Figure 12D:
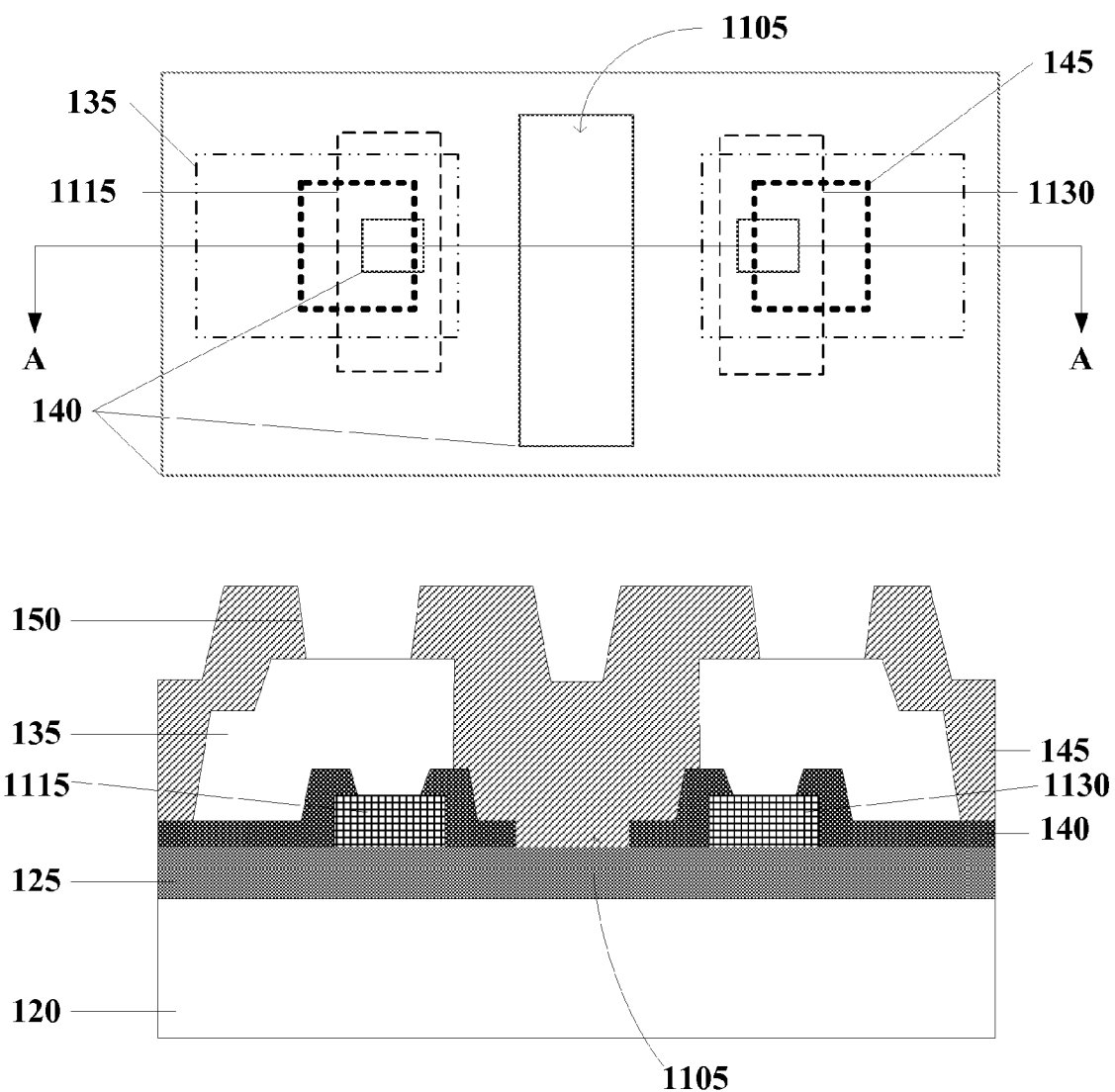

Referring to FIG. 12D, the second passivation layer 145 is then deposited and dry etched. Openings 150 may be formed to contact the conductive layer 135. The second passivation layer 145 may be, for example, a polyimide. In particular, the passivation layer 145 passivates regions of the BST thin film dielectric layer 125 exposed in the opening 1105, thereby interrupting the leakage path that can form between the electrodes 1115, 1130 at the interface of the dielectric layer 125 and the first passivation layer 140.

Although the gap capacitor 1100B of FIG. 11B has been described in considerable detail, other embodiments will be apparent. For example, instead of a blanket BST layer, islands of BST may be formed with the metal for the electrodes 1115, 1130 lying partially on the dielectric layer 125 and partially on the substrate 120. In addition, the gap capacitor 1100B in FIG. 11B is drawn with specific shapes for the electrodes 1115, 1130, the dielectric layer 125, and the opening 1105 in the first passivation layer 140. However, this is not meant as a limitation since the specific geometries and shapes shown are not required. The figures are used to illustrate the passivation structure to break the leakage path between electrodes 1115, 1130 at the interface of the BST thin film dielectric layer 125 and the first passivation layer 140. Similar passivation structures, potentially of varying geometries, can be applied to gap capacitors of different shapes.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes, and variations that will be apparent to those skilled in the art may be made in the arrangement, operation, and details of the method and apparatus of the present invention disclosed herein without departing from the spirit and scope of the invention as defined in the appended claims. Therefore, the scope of the invention should be determined by the appended claims and their legal equivalents.

What is claimed is:

1. A ferroelectric thin film device, the device comprising:
a substrate;
a first electrode integrated on the substrate;
a ferroelectric thin film dielectric layer contacting the first electrode;
a second electrode contacting the dielectric layer;
a first passivation layer overlying the first electrode, the dielectric layer, and the second electrode, wherein the first passivation layer further comprising an opening exposing a portion of the dielectric layer along a path between the first electrode and the second electrode, the path extending along a surface of the dielectric layer; and
a second passivation layer contacting the dielectric layer through the opening.

2. The device of claim 1, wherein the ferroelectric thin film dielectric layer comprises at least one of the materials selected from a group consisting of: barium titanate (BT), strontium titanate (ST), and barium strontium titanate (BST).

3. The device of claim 1, wherein the first passivation layer comprises silicon nitride.

4. The device of claim 1, wherein the first passivation layer comprises silicon dioxide or aluminum oxide.

5. The device of claim 1, wherein the second passivation layer comprises polyimide or bisbenzocyclobutene.

6. The device of claim 1, wherein the first electrode comprises platinum.

7. The device of claim 1, wherein the second electrode comprises platinum.

8. The device of claim 1, wherein the device comprises a capacitor.

9. The device of claim 8, wherein the opening comprises a ring surrounding an active region of the device.

10. The device of claim 9, wherein a shape of the ring comprises rectangular.

11. The device of claim 8, wherein the opening only partially surrounds an active region of the device.

12. The device of claim 8, wherein the opening also exposes a portion of the second electrode.

13. The device of claim 12, wherein the second passivation layer also contacts the second electrode exposed through the opening.

14. The device of claim 8, wherein the capacitor comprises a parallel plate capacitor wherein the ferroelectric thin film dielectric layer is sandwiched between the first electrode and the second electrode.

15. The device of claim 1, wherein the device comprises a resistor wherein a current flow through the resistor flows primarily at an interface between the dielectric layer and the first passivation layer.

16. The device of claim 1, wherein the device comprises a capacitor coupled in parallel with an integrated resistor, wherein a current flow through the resistor flows primarily at an interface between the dielectric layer and the first passivation layer.

17. A ferroelectric parallel plate capacitor comprising:
a first electrode;
a dielectric layer overlying a portion of the first electrode;

a second electrode overlying a portion of the dielectric layer;

a first passivation layer overlying the first electrode, the dielectric layer, and the second electrode, wherein the first passivation layer further comprising an opening exposing a portion of the dielectric layer along a path between the first electrode and the second electrode, the path extending along a surface of the dielectric layer; and a second passivation layer contacting the dielectric layer through the opening.

18. The capacitor of claim 17, wherein the dielectric layer comprises at least one of the materials selected from a group consisting of: barium titanate (BT), strontium titanate (ST), and barium strontium titanate (BST).

19. The capacitor of claim 17, wherein the first passivation layer comprises silicon nitride.

20. The capacitor of claim 17, wherein the first passivation layer comprises silicon dioxide or aluminum oxide.

21. The capacitor of claim 17, wherein the second passivation layer comprises polyimide or bisbenzocyclobutene.

22. The capacitor of claim 17, wherein the first electrode comprises platinum.

23. The capacitor of claim 17, wherein the second electrode comprises platinum.

24. The capacitor of claim 17, wherein the opening comprises a ring surrounding an active region of the capacitor.

25. The capacitor of claim 24, wherein a shape of the ring comprises rectangular.

26. The capacitor of claim 17, wherein the opening only partially surrounds an active region of the capacitor.

27. The capacitor of claim 17, wherein the opening also exposes a portion of the second electrode.

28. The capacitor of claim 27, wherein the second passivation layer also contacts the second electrode exposed through the opening.

29. A method of fabricating a ferroelectric parallel plate capacitor, the method comprising:

forming a bottom electrode supported by a substrate;

forming a ferroelectric thin film dielectric layer over the bottom electrode;

forming a top electrode over the dielectric layer;

forming a first passivation layer overlying the bottom electrode, the dielectric layer, and the top electrode, the first passivation layer including an opening exposing a portion of the dielectric layer along a path between the top electrode and the bottom electrode, the path extending along a surface of the dielectric layer; and forming a second passivation layer overlying the first passivation layer and contacting the dielectric layer through the opening.

30. The method of claim 29, wherein the second passivation layer also contacts the bottom electrode through the opening.

31. The method of claim 29, wherein the step of forming a first passivation layer comprises:

depositing a first passivation material over the substrate;

depositing an etch mask over the first passivation material, the etch mask defining the lateral shape of the first passivation layer including the opening; and removing a portion of the first passivation material, thereby exposing a portion of the dielectric layer through the opening.

32. The method of claim 31, wherein the step of removing a portion of the first passivation material further comprises exposing a portion of the bottom electrode through the opening.

33. The method of claim 32, wherein the second passivation layer also contacts the bottom electrode through the opening.

34. The method of claim 29, wherein the first passivation layer consists essentially of a silicon nitride.

35. The method of claim 29, wherein the first passivation layer consists essentially of an aluminum oxide or a silicon dioxide.

36. The method of claim 29, wherein the second passivation layer consists essentially of polyimide or bisbenzocyclobutene.

37. The method of claim 29, wherein the bottom electrode comprises platinum.

38. The method of claim 29, wherein the ferroelectric thin film dielectric layer comprises at least one of the materials selected from a group consisting of: barium titanate (BT), strontium titanate (ST), and barium strontium titanate (BST).

39. The method of claim 29, wherein the opening comprises a ring surrounding an active region of the capacitor.

40. The method of claim 39, wherein a shape of the ring comprises rectangular.

41. The method of claim 29, wherein the opening only partially surrounds an active region of the capacitor.

42. A ferroelectric thin film resistor, the resistor comprising:

a substrate;

a first electrode integrated on the substrate;

a ferroelectric thin film layer contacting the first electrode;

a second electrode contacting the ferroelectric thin film layer; and a first passivation layer overlying the first electrode, the ferroelectric thin film layer, and the second electrode, a current flowing through the resistor at an interface between the ferroelectric thin film layer and the first passivation layer, wherein the first passivation layer includes an opening exposing a portion of the ferroelectric thin film layer along a path between the first electrode and the second electrode, the path extending along the interface between the ferroelectric thin film layer and the first passivation layer.

43. The resistor of claim 42, wherein the ferroelectric thin film layer comprises at least one of the materials selected from a group consisting of: barium titanate (BT), strontium titanate (ST), and barium strontium titanate (BST).

44. The resistor of claim 42, wherein the first passivation layer comprises silicon nitride.

45. The resistor of claim 42, wherein the first passivation layer comprises silicon dioxide or aluminum oxide.

46. The resistor of claim 42, wherein the first electrode comprises platinum.

47. The resistor of claim 42, further comprising a second passivation layer overlying the first passivation layer wherein the second passivation layer contacts the ferroelectric thin film layer through the opening.

* * * * *